United States Patent
Suzuki et al.

(10) Patent No.: US 7,418,056 B2
(45) Date of Patent: Aug. 26, 2008

(54) DIGITAL PREDISTORTER USING POWER SERIES MODEL

(75) Inventors: Yasunori Suzuki, Yokohama (JP); Shinji Mizuta, Yokohama (JP); Yasushi Yamao, Yokosuka (JP)

(73) Assignee: NTT DoCoMo, Inc., Tokyo (JP)

( * ) Notice: Subject to any disclaimer, the term of this patent is extended or adjusted under 35 U.S.C. 154(b) by 527 days.

(21) Appl. No.: 11/044,586

(22) Filed: Jan. 28, 2005

(65) Prior Publication Data

US 2005/0180527 A1 Aug. 18, 2005

(30) Foreign Application Priority Data

Jan. 29, 2004 (JP) ............... 2004-021031

(51) Int. Cl.
*H04L 25/49* (2006.01)

(52) U.S. Cl. ..................... 375/296

(58) Field of Classification Search ............... 375/295, 375/296, 297; 398/193; 455/114.3
See application file for complete search history.

(56) References Cited

U.S. PATENT DOCUMENTS

| | | | |
|---|---|---|---|
| 5,164,678 A | 11/1992 | Puri et al. | |
| 6,549,067 B1 | 4/2003 | Kenington | |
| 6,580,320 B1 | 6/2003 | Kenington et al. | |
| 2001/0050592 A1* | 12/2001 | Wright et al. | 330/2 |
| 2002/0044014 A1* | 4/2002 | Wright et al. | 330/2 |
| 2004/0179629 A1* | 9/2004 | Song et al. | 375/296 |
| 2005/0111575 A1* | 5/2005 | Taler et al. | 375/297 |
| 2005/0180527 A1 | 8/2005 | Suzuki et al. | |
| 2006/0240786 A1* | 10/2006 | Liu | 455/114.3 |

OTHER PUBLICATIONS

Byeong Yeol Ryu, et al., "Implementation of a Linearized Power Amplifier using a Adaptive Digital Predistorter", Paper A of the Institute of Electronics Engineers of Korea, 31A (12), 1994, pp. 9-15 (with English Abstract).

Henri Girard, et al., "A New Baseband Linearizer for More Efficient Utilization of Earth Station Amplifiers Used for QPSK Transmission", IEEE Journal on Selected Areas in Communications, vol. SAC-1, No. 1, Jan. 1983, pp. 46-56.

Yoshiharu Okamoto, et al., "TWT Amplifier Linearization by IF Band Predistortion", IEICE Technical Study Report, MW76-112, 1976, pp. 73-78, with Partial English Translation.

(Continued)

*Primary Examiner*—Sam K Ahn
(74) *Attorney, Agent, or Firm*—Oblon, Spivak, McClelland, Maier & Neustadt, P.C.

(57) ABSTRACT

A digital predistorter compensates for nonlinear distortion of a power amplifier using a power series model. The digital predistorter includes a distortion generating unit configured to introduce a nonlinear distortion component of a prescribed order into a digital input signal supplied to the digital predistorter. The distortion generating unit has a multiplier configured to raise the digital input signal to a power consistent with the prescribed order of the nonlinear distortion component, and a finite impulse response filter connected in series with the multiplier. The digital predistorter also includes an adaptive controller configured to receive a reference signal and adaptively adjust the tap coefficient of the finite impulse response filter so as to bring the reference signal to a desired level.

18 Claims, 20 Drawing Sheets

OTHER PUBLICATIONS

Giovanni Lazzarin, et al., "Nonlinearity Compensation in Digital Radio Systems", IEEE Transactions on Communications, vol. 42, No. 2/3/4, Feb./Mar./Apr. 1994, pp. 988-999.

Toshio Nojima, et al., Cuber Predistortion Linearizer for Relay Equipment in 800 MHz Band Land Mobile Telephone System, IEEE Transactions on Vehicular Technology, vol. VT-34, No. 4, Nov. 1985, pp. 169-177.

Hyunchul Ku, et al., "Quantifying Memory Effects in RF Power Amplifiers", IEEE Transactions on Microwave Theory Techniques, vol. 50, No. 12, Dec. 2002, pp. 2843-2849.

Toshio Nojima, et al., "Analysis and Compensation of TWT Nonlinearities Based on Complex Power Series Representation", Trans. IECE '81/12, vol. J64-B, No. 12, pp. 1449-1456, with Partial English translation.

U.S. Appl. No. 11/444,494, filed Jun. 1, 2006, Suzuki et al.

U.S. Appl. No. 11/446,381, filed Jun. 5, 2006, Suzuki et al.

* cited by examiner

DIGITAL PREDISTORTER USING POWER SERIES MODEL

FIELD OF THE INVENTION

The present invention relates to a technique for reducing nonlinear distortion in amplifiers, and more particularly, to digital predistortion based on a power series model.

BACKGROUND OF THE INVENTION

It is necessary for wireless transmission to sufficiently compensate for nonlinear distortion generated in power amplifiers when appropriately transmitting amplitude-varying signals using a linear modulation scheme. Digital predistortion is a technique for canceling distortion produced in a power amplifier by adding an inverse distortion component to the signal input to the power amplifier. In order to achieve a satisfactory compensation effect, the amplitude and the phase of the distortion component to be added to the input signal have to be controlled at high accuracy.

One method for realizing the predistortion is using a lookup-table type predistorter configured to look for an appropriate distortion component from the lookup table corresponding to the input signal. This method is described in H. Girard and K. Feher, "A New Baseband Linearizer for More Efficient Utilization of Earth Station Amplifiers Used for QPSK Transmission", IEEE J. Select Areas Commun., Vol.SAC-1, No. 1, 1983.

From the viewpoint of achieving more accurate distortion compensation, a power series predistorter that represents the nonlinear distortion characteristic of the power amplifier using a power series model is known. See, for example, Okamoto, Nojima, and Ohoyama, "Analysis and Compensation of nonlinear distortion in a travelling-wave tube amplifier based on IF Band Predistortion", IEICE Technical Study Report, MW76-112, 1976.

U.S. Pat. No. 5,164,678 issued to Puri et al, entitled "Process for Compensating nonlinearities in an Amplifier Circuit" discloses automatic control for a power-series predistorter. In this publication, the output signal from the power amplifier and the respective degrees of distortion components generated by a digital predistorter are subjected to fast Fourier Transform (FFT) to perform frequency conversion, and the coefficients of the respective degrees are estimated.

Similarly, G. Lazzarin, S. Pupolin, and A. Sarti, "Nonlinearity Compensation in Digital Radio Systems", IEEE Trans. Commun., Vol.42, No. 2/3/4, February/March/April, 1994 discloses a technique for controlling polynomial coefficients of a digital predistorter. In this publication, a covariance matrix is calculated for the signal generated by the digital predistorter, and the difference between the output signal of the power amplifier and the signal generated by the digital predistorter is used as an error to control the polynomial coefficients of the predistorter.

Another publication, T. Nojima and T. Konno, "Cuber Predistortion Linearizer for Relay Equipment in 800 MHz Band Land Mobile Telephone System", IEEE Trans. Vech. Tech., Vol.VT-34, No. 4, Nov.1985, discloses automatic control of a power-series predistorter. In this publication, the predistorter is controlled using pilot signals in certain carrier frequencies so as to allow the polynomial to follow change in temperature or change over time in the power amplifier. This technique is practically applied to transmission amplifiers of boosters for automobile telephones.

Conventional power-series type predistorters can achieve satisfactory nonlinearity (or distortion) compensation if a sufficient amount of output backoff is guaranteed, as illustrated in FIG. 1A, or if a narrow band modulation wave is used. However, in order to operate the power amplifier more efficiently, the output backoff has to be compressed. Consequently, the predistorter is required to have an improved ability to perform distortion compensation so as to guarantee linear operation at higher input power levels.

FIG. 2 is a chart showing an experimental result measuring the relative phase of a third-order distortion component as a function of output level of a power amplifier. In the experiment, a pair of fundamental waves (or carrier waves) 102 and 104 with a center frequency f0, as illustrated in FIG. 1B, are input to the power amplifier at various power levels, and the output signals are measured. In addition to the amplified fundamental waves 102 and 104, third-order distortion components (nonlinear components) 106 and 108 appear in the output signal from the power amplifier. Usually, the third and higher distortions are generated; however, only the third-order distortion components are illustrated in FIG. 1B for the sake of simplification.

The two plots 202 and 204 shown in the chart of FIG. 2 correspond to the lower part third-order distortion 106 and the upper part third-order distortion 108 shown in FIG. 1B, respectively. Ideally, these two plots are consistent with each other over the entire output power range. If these two components agree with each other, compensating for one of the third-order distortion leads directly to compensation for the other (paired) distortion component. In contrast, if the two components do not agree with each other, a nonlinear component still remains in the signal unless both distortion components are compensated for.

In general, these two distortion components are close to each other at a low power level (for example, at or below 20 dBm), as illustrated in FIG. 2. This result agrees with the presumption that satisfactory distortion compensating effect can be achieved if a sufficient amount of output backoff is guaranteed. In contrast, if the output power level increases, the two plots 202 and 204 do not agree with each other, which means that compensation of distortion components becomes difficult in a range in which the output backoff is insufficient. The value of the third or higher order distortion component varies depending on frequency. This phenomenon is known as the "memory effect". A method for excluding the memory effect using a time-varying filter model is described in H. Ku, D. McKinley and J. S. Kenny, "Quantifying Memory Effects in RF Power Amplifiers", IEEE Transactions on Microwave Theory and Techniques, Vol.50, No. 12, pp.2843-2849, December 2002.

Meanwhile, the input signal being input to the predistorter has a certain degree of randomness, and accordingly, the memory effect may vary in response to the input signal varying over time. In other words, the frequency-dependent nonlinearity may vary over time. However, the conventional predistorters cannot follow such a change over time satisfactorily, and consideration of highly precise nonlinearity compensation has not been made sufficiently.

It may be proposed to cause the predistorter to follow the change over time in the distortion component using a pilot signal. In this case, the distortion component has to be compensated for using a pilot signal within, for example, the period of training sequence, independently from the signal transmission. However, because the pilot signal cannot always be acquired, it is difficult to easily and accurately compensate for the distortion using a pilot signal. In addition, compensating for the distortion using a pilot signal includes many steps, such as inputting a prescribed pilot signal to the predistorter, supplying the output of the predistorter to the power amplifier, scanning the entire frequency range to detect nonlinear distortion components, and controlling various parameters so as to reduce the detected distortion components. Accordingly, the process and the structure may become complicated.

Since it is proposed to use broadband modulation signals in the near future for wireless communication systems, highly precise compensation for distortion components is required for broad band signals over several tens of megahertz (MHz). As the frequency range to be used increases, the change in the frequency-dependent nonlinear distortion components is likely to increase, and therefore, the problem will become more serious.

SUMMARY OF THE INVENTION

Therefore, it is an object of the present invention to solve the above-described problems in the prior art, and to provide a digital predistorter capable of highly precise nonlinear distortion compensation for a power amplifier based on power series analysis.

To achieve the object, in one aspect of the invention, a digital predistorter using a power series model to compensate for nonlinear distortion of a power amplifier is provided. The digital predistorter comprises:

(a) a distortion generating unit configured to introduce a nonlinear distortion component of a prescribed order into a digital input signal supplied to the digital predistorter, the distortion generating unit having a multiplier configured to raise the digital input signal to a power consistent with the prescribed order of the nonlinear distortion component, and a finite impulse response filter connected in series with the multiplier; and (b) an adaptive controller configured to receive a reference signal and adaptively adjust a tap coefficient of the finite impulse response filter so as to bring the reference signal to a desired level.

With this arrangement, the tap coefficient of the finite impulse response filter is adaptively controlled so as to introduce the nonlinear distortion component that can efficiently cancel the distortion generated in the power amplifier, and accordingly, distortion compensation accuracy can be improved.

The reference signal is, for example, a feed-forward signal derived from the digital input signal. With this arrangement, the adaptive control is performed based on the signal that has not been subjected to amplification, and therefore, the control speed can be increased.

The reference signal may be a feedback signal derived from the output of the power amplifier. In this case, the adaptive control is performed based on the actually amplified signal, and therefore, distortion compensation accuracy can be further improved.

The feedback signal is obtained by, for example, subtracting a first signal in proportion to the digital input signal or to a power of the digital input signal from a second signal derived from an output of the power amplifier. By removing the dominant linear component (i.e., the fundamental wave), a nonlinear distortion component that is to be compensated for can be extracted.

The adaptive controller may be configured to receive both the feed-forward signal and the feedback signal as the reference signals. In this case, the adaptive controller adjusts the tap coefficient of the finite impulse filter so as to reduce the difference between the feed-forward signal and the feedback signal.

In another aspect of the invention, a transmitter using a digital predistorter is provided. The transmitter comprises a power amplifier configured to amplify a digital transmission signal, and a digital predistorter connected to the power amplifier and configured to compensate for nonlinear distortion of the power amplifier using a power series model. The digital predistorter includes:

(a) a distortion generating unit configured to introduce a nonlinear distortion component of a prescribed order into the digital transmission signal supplied to the digital predistorter prior to being input to the power amplifier, the distortion generating unit having a multiplier configured to raise the digital transmission signal to a power consistent with the prescribed order of the nonlinear distortion component, and a finite impulse response filter connected in series with the multiplier; and (b) an adaptive controller configured to receive a reference signal and adaptively adjust a tap coefficient of the finite impulse response filter so as to bring the reference signal to a desired value.

With this arrangement, the transmitter can transmit a signal under efficient control of nonlinearity compensation.

BRIEF DESCRIPTION OF THE DRAWINGS

Other objects, features, and advantages of the invention will become more apparent from the following detailed description when read in conjunction with the accompanying drawings, in which.

DETAILED DESCRIPTION OF THE PREFERRED EMBODIMENT

The preferred embodiments of the present invention are now described in detail in conjunction with the attached drawings. The same components are denoted by the same reference numbers throughout the drawings. In the first embodiment, feedback control is employed. In the second embodiment, feed-forward control is employed. In the third embodiment, both feedback control and feed-forward control are employed.

Figure 1A:
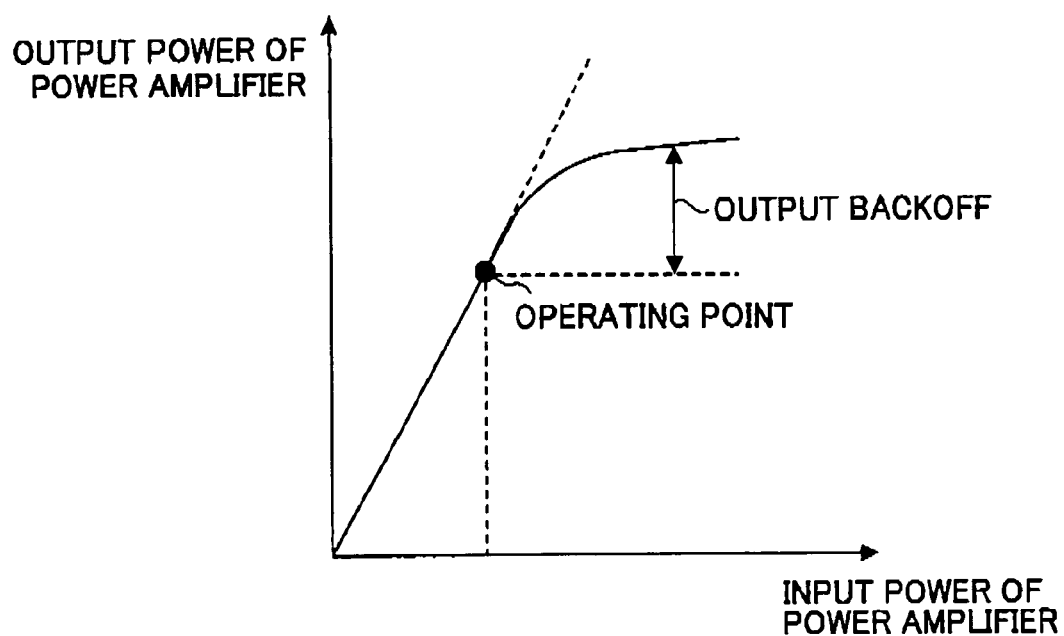
FIG. 1A is a chart illustrating a general input/output characteristic of a power amplifier.
Figure 1B:
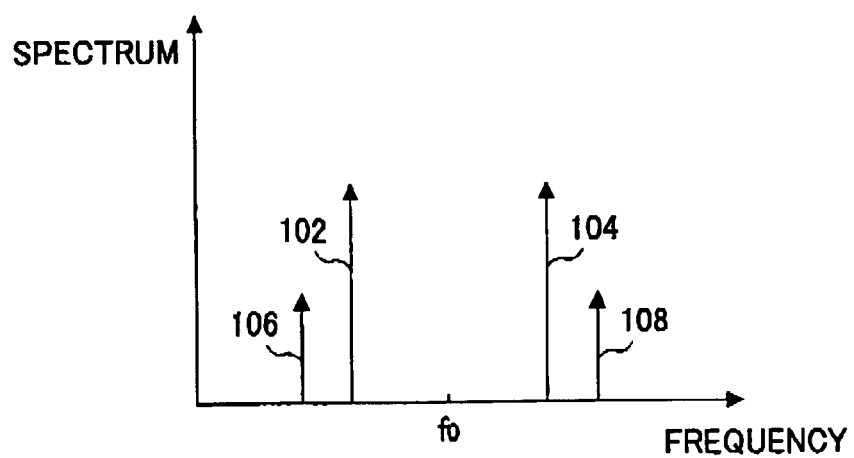
FIG. 1B is a chart illustrating the spectrum of the output signal from the power amplifier.
Figure 2:
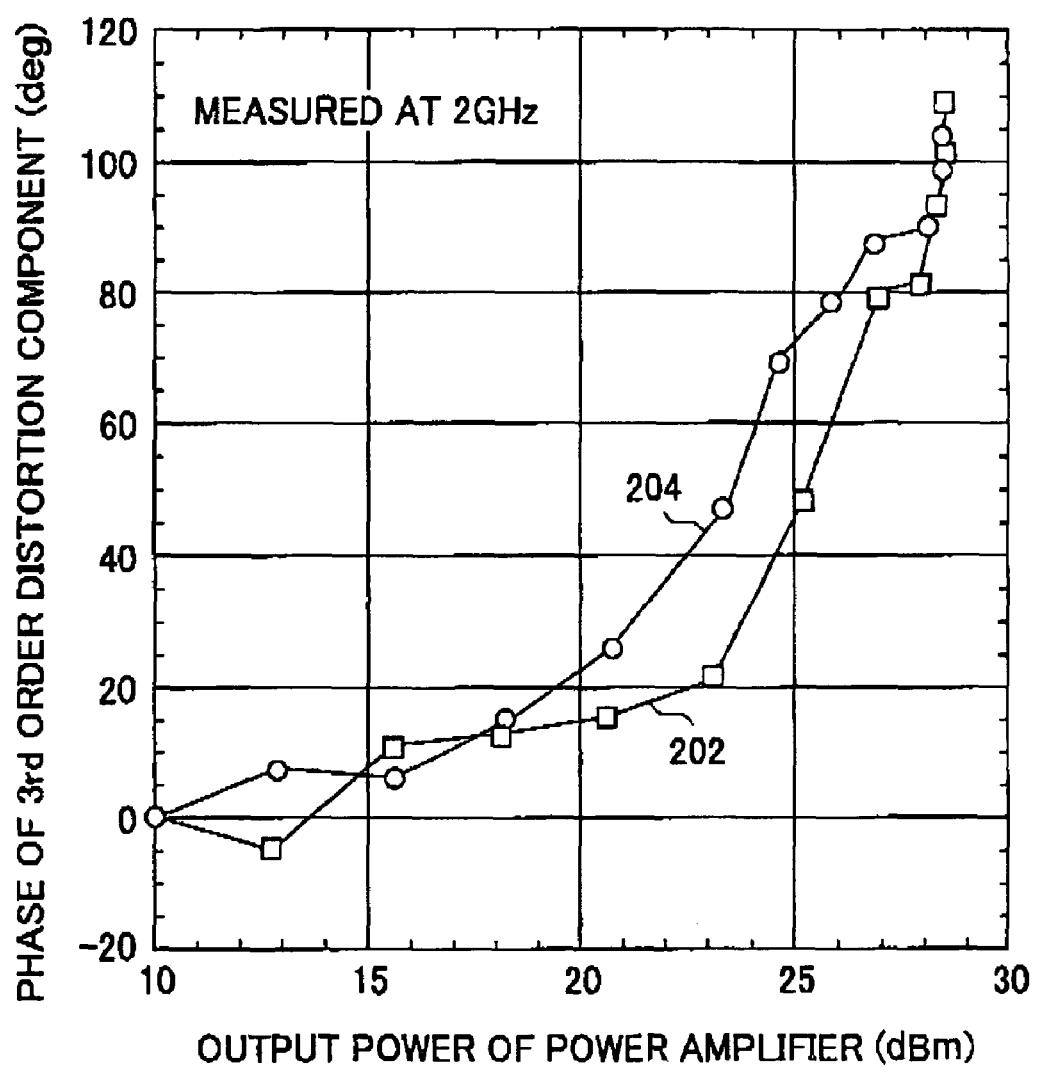
FIG. 2 is a graph plotting phase of the third-order distortion component as a function of output power level of the power amplifier.
Figure 3:
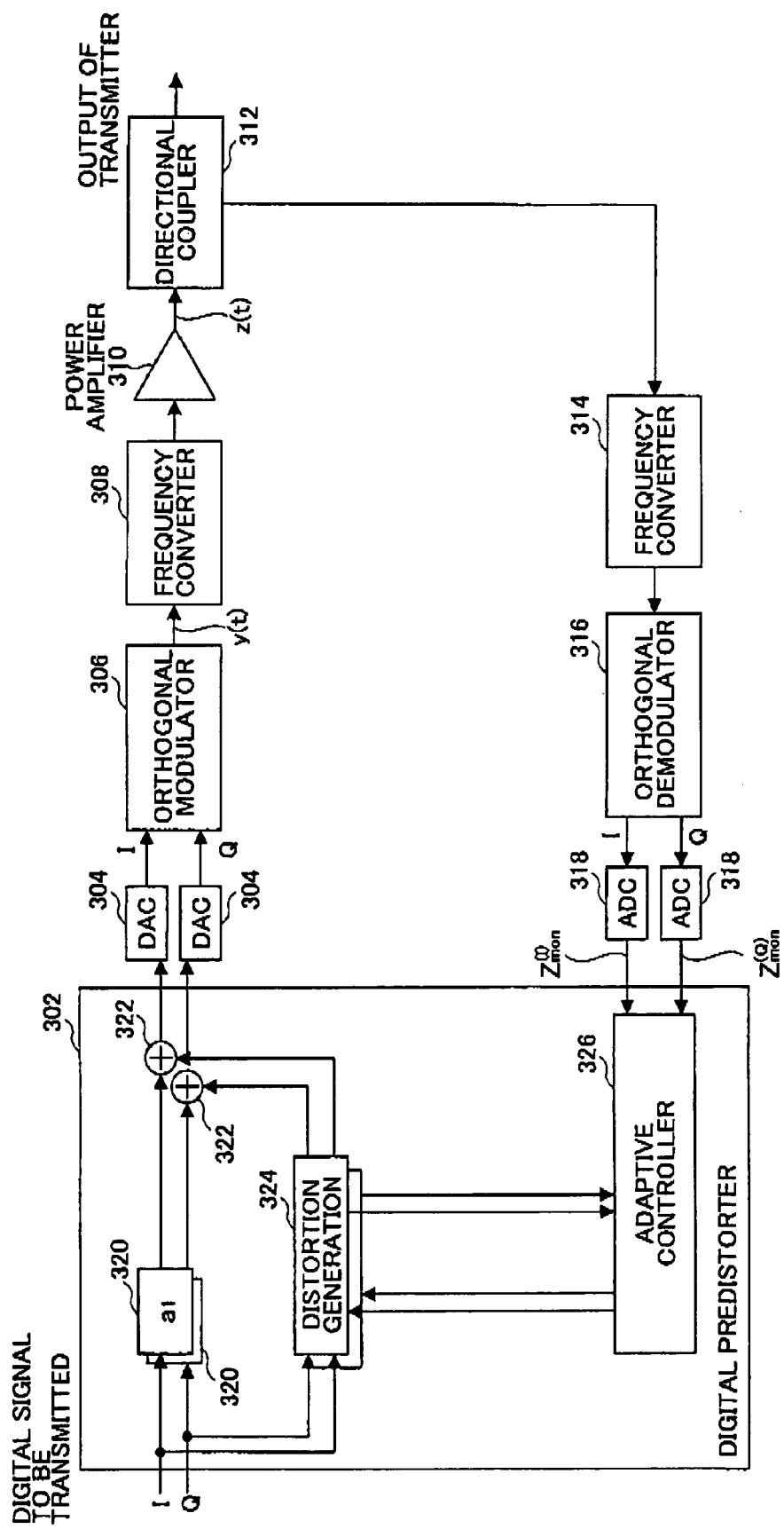
FIG. 3 is a schematic diagram illustrating a part of a transmitter employing a digital predistorter according to the first embodiment of the invention.

FIG. 3 is a schematic diagram illustrating a part of a transmitter using a digital predistorter according to the first embodiment of the invention.

The signal transmission system of the transmitter includes a digital predistorter 302, a digital-to-analog converter (DAC) 304, an orthogonal modulator 306, a frequency converter 308, and a power amplifier 310. The feedback system of the transmitter includes a directional coupler 312, a frequency converter 314, an orthogonal demodulator 316, and an analog-to-digital converter (ADC) 318. The digital predistorter 302 has a pair of coefficient multipliers 320, a pair of adders 322, a pair of distortion generating units 324, and an adaptive controller 326.

The digital predistorter 302 receives a digital signal to be transmitted (referred to as a "digital transmission signal"), as indicated at the top left of the figure. The inphase component (I component) and the quadrature component (Q component) of the digital signal are input to the digital predistorter 302 separately from each other. The digital transmission signal is generally a baseband signal, as in the embodiment; however, it may be a signal of an intermediate frequency band, depending on the use. The inphase component and the quadrature component of the digital transmission signal are supplied to the associated coefficient multipliers 320, and the amplitude and/or the phase of each component is adjusted by an amount corresponding to an appropriate fixed number "a1" (generally, a complex number). Each of the adjusted components is supplied to one of the input terminals of the associated adder 322.

The inphase component and the quadrature component of the input digital signal are also supplied to the associated distortion generating units 324, which generate nonlinear distortion signals for the corresponding components. The nonlinear distortion signal of each component is supplied to the other input terminal of the associated adder 322. The adaptive controller 326 controls the operation of the distortion generating units 324. The detailed operation of the digital predistorter 302 is described below.

Each of the digital-to-analog converters 304 converts one of the nonlinear distortion-added digital inphase component and quadrature component output from the digital predistorter 302 into an analog form.

The orthogonal modulator 306 combines the inphase component (I) and the quadrature component (Q) into a modulation signal. The modulation signal y(t) is represented as $$y(t) = y_i(m)\cos(2\pi ft) - y_q(m)\sin(2\pi ft)$$

where $y_i(m)$ and $y_q(m)$ denote the inphase component and the quadrature component, respectively, of the m-th symbol of the digital transmission signal.

The frequency converter 308 upconverts the baseband or intermediate-band modulation signal to a radio frequency (RF) signal.

The power amplifier 310 amplifies the power level of the RF signal so as to be suitable for radio transmission. The output signal of the power amplifier 310 contains a distortion component generated by nonlinear amplification, as well as a linearly amplified signal component. The influence of the nonlinear distortion is cancelled by inverse distortion given by the digital predistorter 302 to the digital transmission signal prior to the power amplification The signal output from the power amplifier 310 is treated as an output of the transmitter, and transmitted from an antenna (not shown).

On the other hand, the directional coupler 312 of the feedback system extracts a portion of the amplified signal to be transmitted. The frequency converter 314 downconverts the radio frequency band of the extracted signal to a baseband or an intermediate band. The orthogonal demodulator 316 separates the downconverted signal into an inphase component (I) and a quadrature component (Q). The analog-to-digital converters 318 convert the analog inphase component and the analog quadrature component to digital forms, respectively, and supply the digitally-converted components to the adaptive controller 326.

Figure 4:
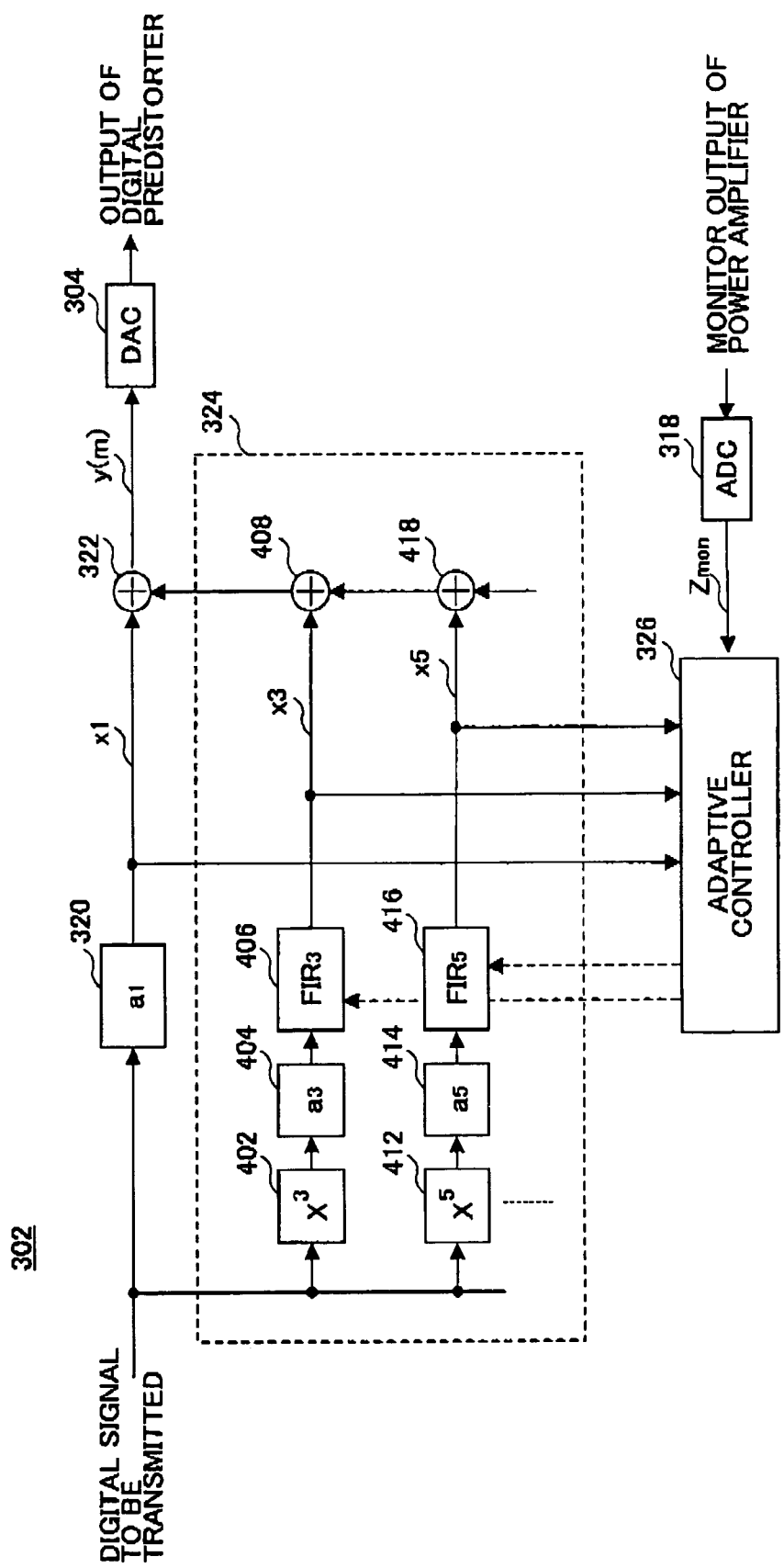
FIG. 4 is a block diagram illustrating the structure of the digital predistorter used in the transmitter shown in FIG. 3.

FIG. 4 illustrates the detailed structure of the digital predistorter 302. Since the basic idea of signal processing is the same for both the inphase component and the quadrature component, illustration is made of only one of the components for simplification (e.g., only the inphase component). The path for the third-order distortion component in the distortion generating unit 324 includes a third-order multiplier 402, a coefficient multiplier 404, a finite impulse response filter (FIR$_3$) 406 for the third order distortion, and an adder 408. The path for the fifth-order distortion component in the distortion generating unit 324 includes a fifth-order multiplier 412, a coefficient multiplier 414, a finite impulse response filter (FIR$_5$) 416 for the fifth order distortion, and an adder 418. Similarly, paths for the higher order distortions are provided in the distortion generating unit 324.

Each of the coefficient multipliers 320, 404, and 414 multiplies the input signal by a prescribed constant (generally, a complex number) indicated as "a1", "a3", or "a5" in the figure. The third order multiplier 402 raises the input signal to the third power, and the fifth order multiplier 412 raises the input signal to the fifth power. Each of the FIR$_3$ 406 and the FIR$_5$ 416 estimates and outputs a weighted average of the input signal and the past data (previously input signals). The weighting is called a tap coefficient. In general, the digital filter (FIR filter) produces an output signal by multiplying the output of each of the delay elements connected in series by a weighting factor and combining the weighted outputs. Alternatively, the digital filter may be configured so as to use Fourier transforms and inverse Fourier transforms to perform the major arithmetic operations at the frequency range. Such digital signal processing can be executed using existing means, such as microprocessors, DSPs, or FPGAs.

The basic operation of the digital predistorter 302 of the first embodiment is now explained. A digital transmission signal input to the digital predistorter 302 is denoted as u(m), where m denotes a parameter designating the number of samplings. If the sampling interval is T, the sampling time t is expressed as $$t=mT. \qquad (1)$$

The output $x_1$ of the coefficient multiplier 320 is expressed as $$x_1 = a_1 * u(m). \qquad (2)$$

The output x3 of the third order FIR filter (FIR$_3$) 406 is expressed as $$x_3 = a_3 * (w_{3B}{}^H) * U_3(m), \qquad (3)$$

where $W_{3B}$ is the (N+1)-dimensional vector consisting of (N+1) tap coefficients of the third order FIR filter (FIR$_3$), $w^{3BH}$ is the complex conjugate transpose of vector $W_{3B}$, and $U_3$ (m) is the (N+1)-dimensional vector consisting of the current and past signals input to the third order FIR filter (FIR$_3$). The complex conjugate transpose of weighting vector $W_{3B}$ and the complex conjugate transpose of the input signal vector $U_3$ (m) are expressed as $$W_{3B}{}^H = (w_0(m), w_1(m), \ldots, w_N(m)) \qquad (4)$$

$$U_3(m)^H = (u^3(m), u^3(m-1), \ldots, u^3(m-N)) \qquad (5)$$

Similarly, the output $x^5$ of the fifth order FIR filter (FIR$_5$) 416 is expressed as $$x_5 = a_s * (w_{5B}{}^H) * U_5(m),$$

where $w_{5B}$ is the (N+1)-dimensional vector consisting of (N+1) tap coefficients of the fifth order FIR filter (FIR$_5$), and $U_5$(m) is the (N+1)-dimensional vector consisting of the current and past signals input to the fifth order FIR filter (FIR$_5$). The higher order signal components $x_7$, $x_9$, ... can be obtained in the same manner.

The output $x_1$ of the coefficient multiplier 320 corresponds to a linearly amplified digital transmission signal. The output $x_3$ of the third order FIR filter (FIR$_3$) corresponds to the third order distortion (nonlinear) component represented by the nonlinearly amplified signal, and the output $x_5$ of the fifth order FIR filter (FIR$_5$) corresponds to the fifth order distortion (nonlinear) component represented by the nonlinearly amplified signal. In the same manner, the seventh and the higher order distortion components can be obtained. The distortion components represented by the nonlinearly amplified signals $X_3$, $X_5$, ... are added to the digital transmission signal at the digital predistorter 302. Accordingly, the output y(m) of the digital predistorter 302 becomes $$y(m) = \sum_{i=1}^{\infty} x_{2i+1}(m) \qquad (6)$$

As is known in the art, the nonlinear distortion components are expressed as odd-order terms. Although the output signal y(m) described above only represents one of the inphase component and the quadrature component, the actual output signal of the digital predistorter 302 contains the inphase component yi(m) and the quadrature component yq(m). The output of the predistorter 302 (containing the inphase and quadrature components) is then converted to a modulation signal y(t), which is expressed as $$y(t) = yi(m)\cos(2\pi ft) - yq(m)\sin(2\pi ft). \qquad (7)$$

If the modulated signal y(t) is input to the power amplifier 310, the output z(t) of the power amplifier 310 is expressed as $$z(t) = b_1 y(t) + b_3 y(t)^3 + \ldots = \sum_{i=1}^{\infty} b_{2i+1} y^{2i+1}(t) \qquad (8)$$

which is a power series of the input signal y(t). The i-th order distortion component is expressed as the i-th order term of the power series polynomial (8). The coefficient bi of the term represents the contribution of the i-th distortion component.

Although there are DACs 304, orthogonal modulator 306, and frequency converter 308 existing between the digital predistorter 302 and the power amplifier 310, the signal processing carried out by these components is not essential to the present invention, and explanation of them is omitted here. In this embodiment, both the output of the digital predistorter 302 and the input to the power amplifier 310 are treated as y(t) for the purpose of simplification.

Returning to FIG. 3, a signal extracted by the directional coupler 312 is downconverted at the frequency converter 314, and separated into the inphase component and the quadrature component at the orthogonal demodulator 316. The separated components are converted to digital forms at the analog-to-digital converters 318. The digitized components are input as feedback signals to the digital predistorter 302. The feedback signals are monitored by the digital predistorter 302, and indicated as $Z_{mon}{}^{(i)}(m)$ and $Z_{mon}{}^{(q)}(m)$ in FIG. 3. For simplification purpose, one of the feedback signals is referred to as $Z_{mon}(m)$. From Equation (8), the feedback signal $Z_{mon}(m)$ is expressed as $$Z_{mon}(m) = b_1 y(m) + b_3 y^3(m) + b_5 y^5(m) + \ldots \qquad (11)$$

Furthermore, using Equation (6) for expressing y(m), the feedback signal $Z_{mon}$ (m) is further expressed as $$z_{mon}(m) = b_1(x_1 + x_3 + x_5 + \ldots) + \qquad (12)$$
$$b_3(x_1 + x_3 + x_5 + \ldots)^3 + b_5(x_1 + x_3 + x_5 + \ldots)^5 + \ldots$$

Next, focusing is made on the output signal $x_1$ of the coefficient multiplier 320 (in which the distortion components have not been introduced yet by the distortion generating unit 324). Assuming that only signal $x_1$ is input to the power amplifier 310, the output signal $z_1$ of the power amplifier contains a linear component due to linear amplification of signal x1 and a nonlinear component due to nonlinear amplification of signal x1. Accordingly, output signal $z_1$ is expressed as $$z_1(m) = c_1 x_1(m) + c_3 x_1(m)^3 + c_5 x_1(m)^5 + \ldots \qquad (13)$$

where ci denotes the coefficient of the term of i-th power. The power series coefficient ci can be determined from the input and output characteristics of the power amplifier 310.

The difference between the feedback signal $Z_{mon}$ (m) and the hypothetical output signal $z_1$(m) is obtained by subtracting Equation (13) from Equation (12).

$$z_{mon}(m) - z_1(m) = (b_1 - c_1)x_1(m) + (b_3 - c_3)x_1(m)^3 + \qquad (14)$$
$$(b_5 - c_5)x_1(m)5 + \ldots + b_1(x_3(m) + x_5(m) + \ldots) +$$
$$b_3(x_3(m)^3 + x_5(m)^3 + \ldots) + b_5(x_3(m)^5 + x_5(m)^5 + \ldots) + \ldots$$

If the estimated power series coefficient ci of the power amplifier and the actual power series coefficient bi are equal to each other (bi=ci), and if the higher order terms are omitted, then Equation (14) is rewritten as $$z_{mon}(m) - z_1(m) = b_1 x_3(m) + b_1 x_5(m) + \ldots \quad (15)$$

$$= b_1 \sum_{i=1}^{\infty} x_{2i+1}(m)$$

$$= \sum_{i=1}^{\infty} e_{2i+1}$$

Depending on product use, the seventh and higher order terms $x_7(m)$, $x_9(m)$, ... may be omitted. The difference $Z_{mon}(m) - z_1(m)$ represents an output signal obtained when only the distortion components $x_3(m)$, $x_5(m)$, ... generated by the distortion generating unit 324 of the digital predistorter 302 are linearly amplified at the power amplifier 310. Each of the terms in Equation (15) corresponds to the error signal $e_{zi+1}$ of the associated order (e.g., the third order, the fifth order, ...). The tap coefficient of each of the FIR filters is adaptively adjusted so as to minimize the terms of Equation (15). Since the tap coefficients are adaptively controlled in accordance with the frequency-dependency or the change over time of the distortion component, efficient predistortion can be realized.

Next, focusing is made on the third order distortion component $x_3$ produced at the distortion generating unit 324. The error signal $e_3(m)$ for the third order distortion is obtained by subtracting the estimated contribution of the seventh and higher order terms from the difference $Z_{mon}(m) - z_1(m)$.

$$e_3(m) = z_{mou}(m) - z_1(m) - c_1 \sum_{i=2}^{\infty} x_{2i+1}(m) \quad (16)$$

$$= b_1 x_3(m) - (b_1 - c_1)$$

$$= \sum_{i=2}^{\infty} x_{2i+1}(m),$$

If the estimated power series coefficient ci of the power amplifier equals the actual power series coefficient bi (bi=ci), the error signal $e_3$ (m) is expressed simply as $$e_3(m) = b_1 * x_3(m). \quad (17)$$

By adaptively controlling the tap coefficient of the third order FIR filter ($FIR_3$) so as to minimize the error signal $e_3(m)$, a distortion component $x_3$ that can cancel the third order distortion introduced by the power amplifier 310 can be generated at the distortion generating unit 324.

Similarly, the error signal $e_5(m)$ for the fifth order distortion component is expressed simply as $$e_5(m) = b_1 * x_5(m). \quad (18)$$

By adaptively controlling the tap coefficient of the fifth order FIR filter ($FIR_5$) so as to minimize the error signal $e_5(m)$, a distortion component $x_5$ that can cancel the fifth order distortion introduced by the power amplifier 310 can be generated at the distortion generating unit 324. The distortion components $x_{2i+1}$ that can cancel the higher order distortion components are also generated in the same manner.

The error signal $e_{2i+1}$ is an evaluation function that has to be made as small as possible in adaptive control. It can be understood from Equations (17) and (18) that the error signals do not contain thermal noise or random errors. Accordingly, the error signals can be minimized, independent of thermal noise or random errors, in the adaptive control of the tap coefficients. To perform adaptive control itself, many existing algorithms, such as a steepest descent method, an LMS method, or an RLS, can be used. Alternatively, a Kalman filter may be used.

Figure 5:
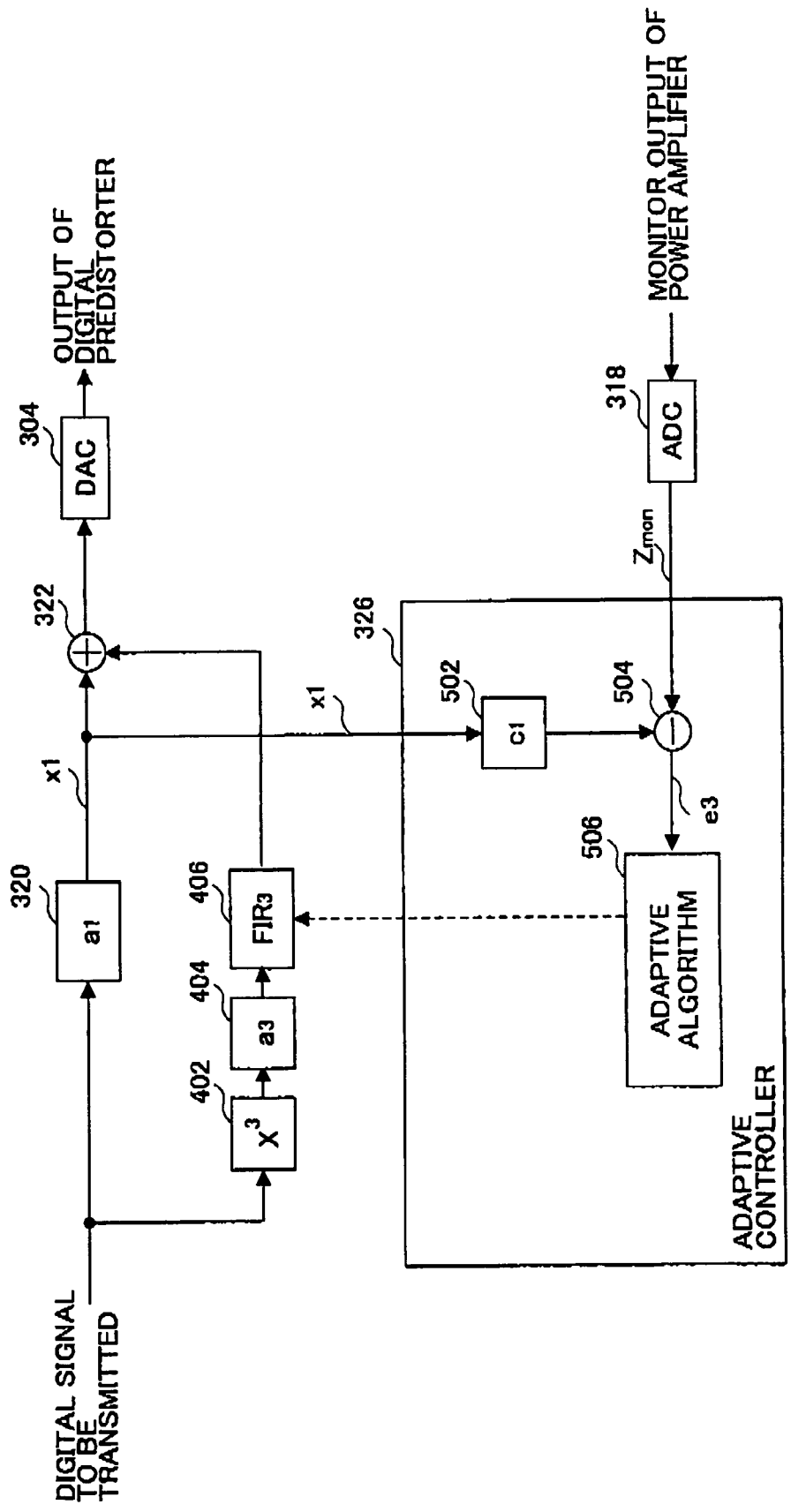
FIG. 5 is a block diagram of an example of the digital predistorter.

FIG. 5 is a block diagram illustrating an example of the digital predistorter 302. In the example shown in FIG. 5, only the third order distortion is considered, and the fifth and higher order distortion components are neglected. The adaptive controller 326 includes a coefficient multiplier 502, a subtractor 504, and an adaptive algorithm unit 506. The feedback signal input to the adaptive controller 326 is expressed as $$Z_{mon}(m) = b_1(x_1 + x_3) + b_3(x_1 + x_3)^3 + \ldots \quad (19)$$

The output of the coefficient multiplier 502 is $c_1 x_1$, which corresponds to $z_1$ explained in the previous example. Accordingly, the output of the subtractor 504 represents an error signal, which is represented as $$Z_{mon}(m) - z_1(m) = (b_1 - c_1)x_1 + b_1 x_3 = b_1 x_3 = e_3$$

where $b_1 = c_1$. The adaptive algorithm unit 506 receives the error signal $e_3$, and adjusts the tap coefficient of the filter $FIR_3$ 406 so as to minimize the error signal $e_3$ by executing an adaptive algorithm described above.

Figure 6:
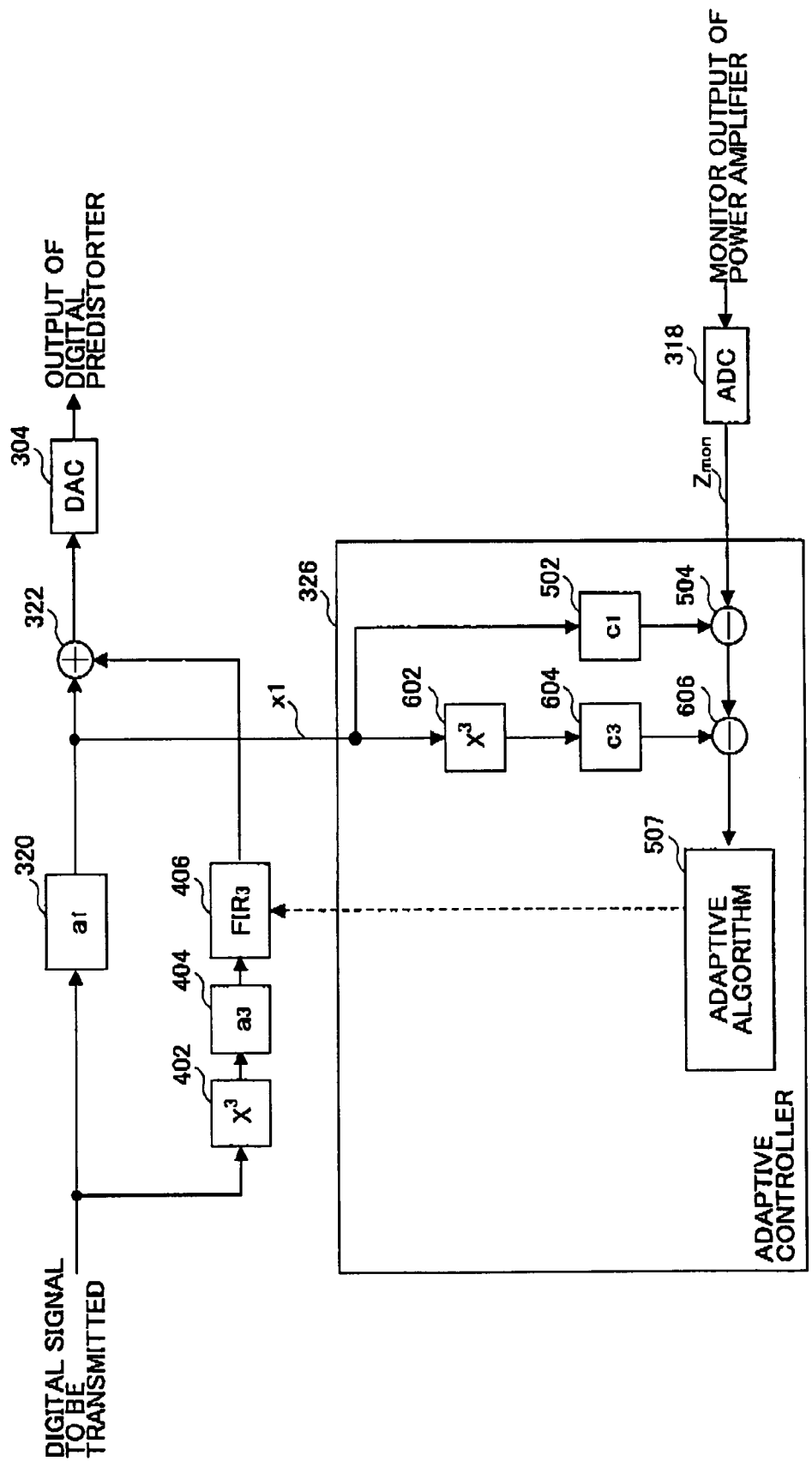
FIG. 6 is a block diagram of another example of the digital predistorter.

FIG. 6 is a block diagram illustrating another example of the digital predistorter 302. In this example, only the third order distortion is considered, and the fifth and higher order distortion components are neglected. The adaptive controller 326 includes a third-order multiplier 602, a coefficient multiplier 604, and a subtractor 606, in addition to the coefficient multiplier 502, the subtractor 504, and the adaptive algorithm unit 506. The feed back signal Zmon is expressed as $$Z_{mon}(m) = b_1(x_1 + x_3) + b_3(x_1 + x_3)^3 + \ldots \quad (20)$$

The output of the coefficient multiplier 502 is $c_1 x_1$, and the output of the other coefficient multiplier 602 is $c_1 x_1^3$. The sum of these two outputs corresponds to $z_1$ explained above. Accordingly, the output of the subtractor 606 represents an error signal, which is represented as $$Z_{mon}(m) - z_1(m) = (b_1 - c_1)x_1 + (b_3 - c_3)x_1^3 + b_1 x_3 = b_1 x_3 = e_3$$

where $b_1 = c_1$ and $b_3 = c_3$. The adaptive algorithm unit 507 receives the error signal $e_3$, and adjusts the tap coefficient of the filter $FIR_3$ 406 so as to minimize the error signal $e_3$. In this example, the term $(b_3 - c_3)x_1^3$ of Equation (14) is considered, unlike the example shown in FIG. 5. Consequently, the error signal $e_3$ is determined more precisely, as compared with the example of FIG. 5.

Figure 7:
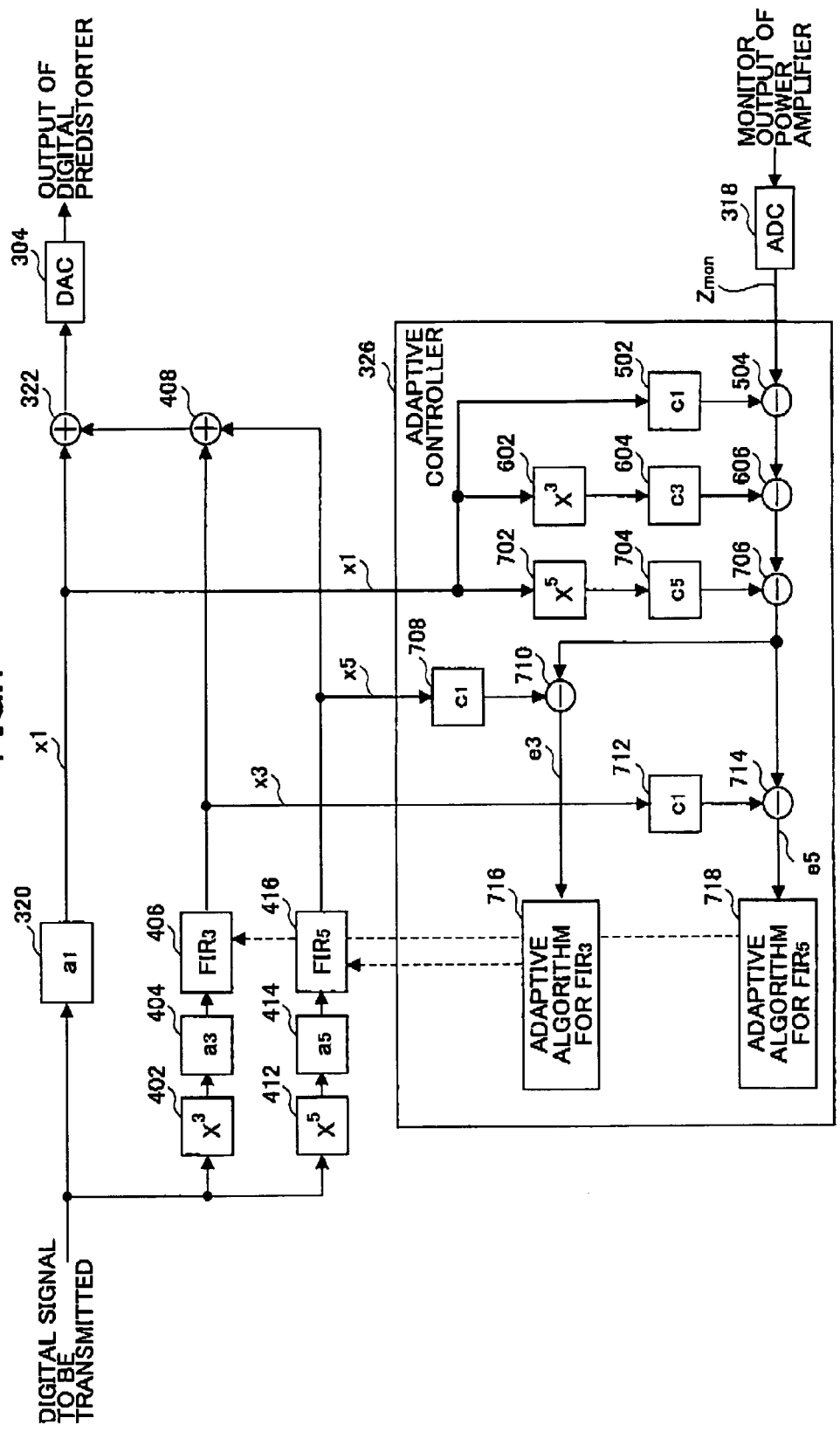
FIG. 7 is a block diagram of still another example of the digital predistorter.

FIG. 7 is a block diagram illustrating still another example of digital predistorter 302. In this example, the third order distortion and the fifth order distortion are considered. The adaptive controller 326 includes a coefficient multiplier 502, a subtractor 504, a third-order multiplier 602, a coefficient multiplier 604, a subtractor 606, and an adaptive algorithm unit 716 for $FIR_3$. The adaptive controller 326 further includes a fifth order multiplier 702, a coefficient multiplier 704, a subtractor 706, a coefficient multiplier 708, a subtractor 710, a coefficient multiplier 712, a subtractor 714, and an adaptive algorithm unit 718 for $FIR_5$. The feed back signal Zmon is expressed as $$Z_{mon}(m) = b_1(x_1 + x_3 + x_5) + b_3(x_1 + x_3 + x_5)^3 + b_5 (x_1 + x_3 + x_5)^5 \ldots \quad (21)$$

The output of the subtractor 706 becomes $$Z_{mon}(m)-(c_1x_1+c_3x_1^3+c_5x_1^5)=(b_1-c_1)x_1+(b_3-c_3)x_1^3+(b_5-c_5)x_1^5+b_1x_3+b_1x_5. \quad (22)$$

Equation (22) corresponds to Equation (14). Since the output of the coefficient multiplier 708 is $c_1x_5$, the output of the subtractor 710 becomes $$(b_1-c_1)x_1+(b_3-c_3)x_1^3+(b_5-x_5)x_1^5+b_1x_3+(b_1-c_1)x_5=b_1x_3=e_3,$$

where $b_1=c_1$, $b_3=c_3$, and $b_5=c_5$. This output is an error signal for the third order distortion. The adaptive algorithm unit 716 receives the error signal $e_3$, and adaptively controls the tap coefficient of filter $FIR_3$ 406 so as to minimize the error signal $e_3$.

Figure 8A:
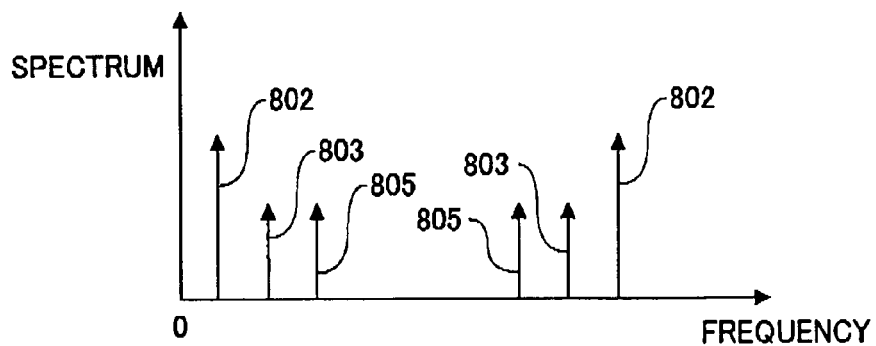
FIG. 8A through FIG. 8C are spectrum diagrams of linearly amplified and nonlinearly amplified signal components.
Figure 8B:
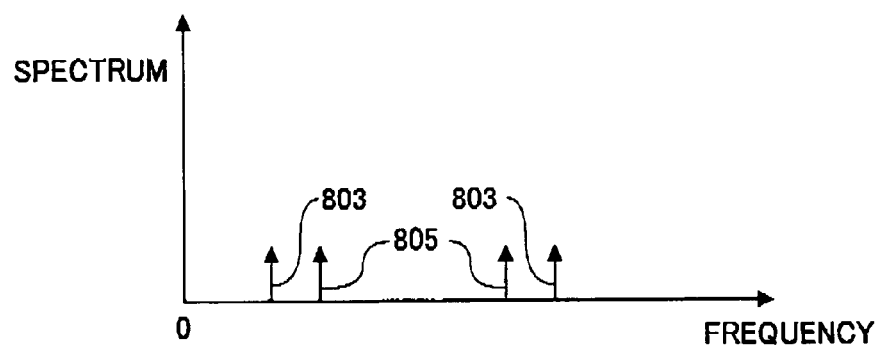
Figure 8C:
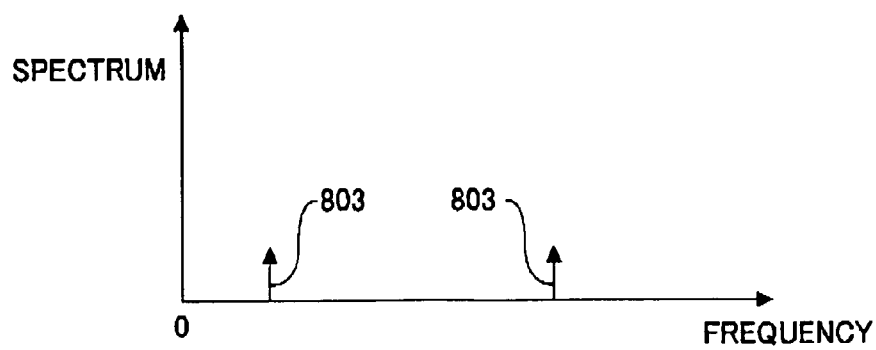

FIG. 8A through FIG. 8C are diagrams of signal spectra. As illustrated in FIG. 8A, the baseband feedback signal $Z_{mon}$ contains a linearly amplified fundamental wave component 802, a nonlinearly amplified third order distortion component 803, and a nonlinearly amplified fifth order distortion component 805. The signal $x_1$ of the fundamental wave is raised to power 3 or power 5, and multiplied by an appropriate coefficient to obtain $z_1$. When the component $z_1$ is subtracted from the feedback signal $Z_{mon}$, the fundamental wave 802 and portions of the nonlinear distortion components are removed, as illustrated in FIG. 8B. Since the remaining fifth order distortion component is obtained as the output of the coefficient multiplier 708, the remaining component is further subtracted by the subtractor 710. Then, the resultant component is the third order distortion component $e_3$, as illustrated in FIG. 8C. The third order distortion component is obtained as the output of the coefficient multiplier 712, this component is also subtracted by the subtractor 714, and the fifth distortion component $e_5$ is extracted.

Figure 9:
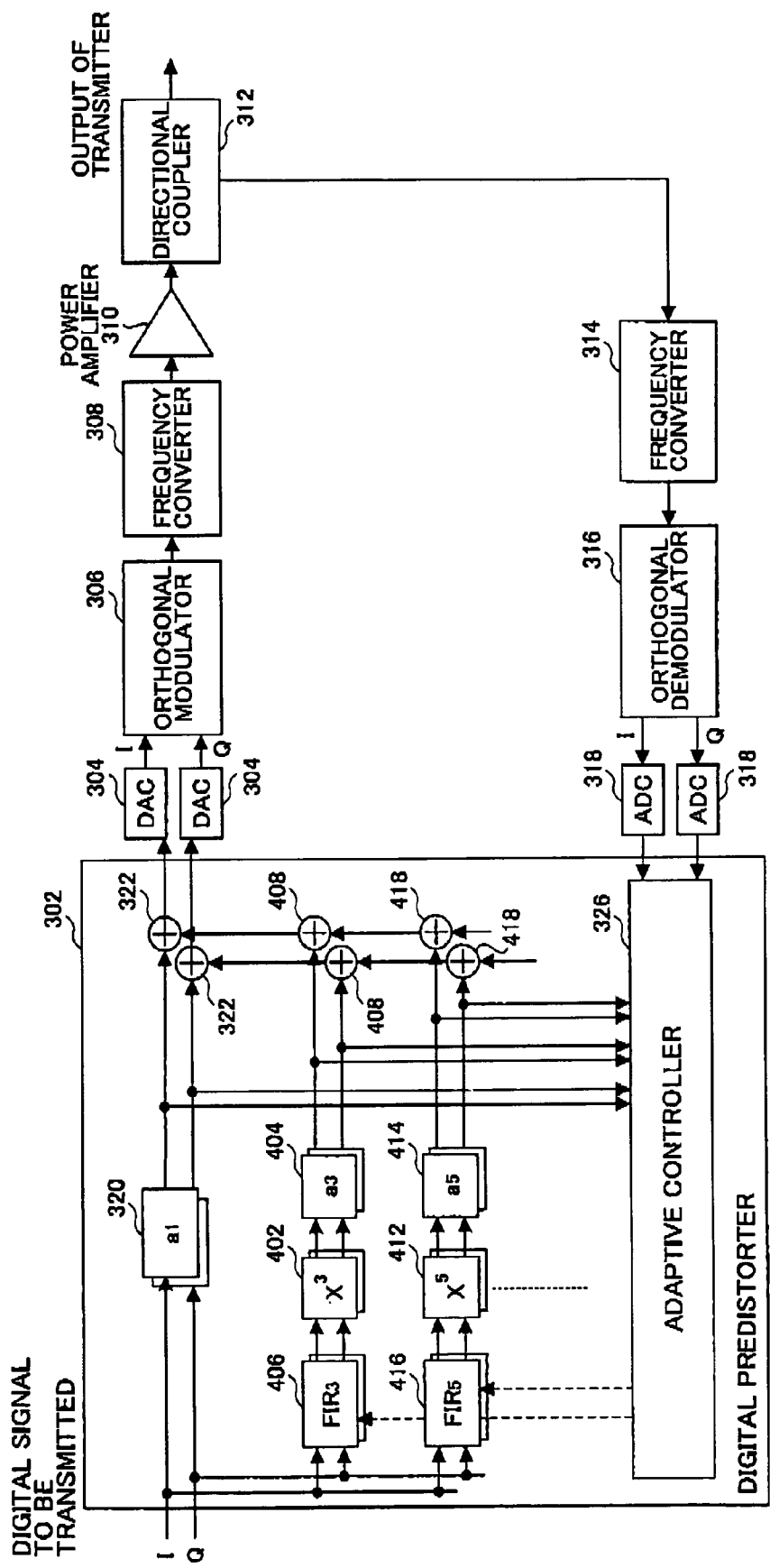
FIG. 9 is a schematic diagram illustrating a part of a transmitter using a digital predistorter according to still another example.

FIG. 9 is a schematic diagram illustrating a modification of the transmitter using the digital predistorter. In this example, the output of the finite impulse response filters $FIR_3$ and $FIR_5$ are connected to the inputs of the multipliers 402 and 412, respectively. This structure is different from that shown in FIG. 4, in which the inputs to the filters $FIR_3$ and $FIR_5$ are connected to the outputs of the multipliers. The multipliers 402 and 404 may be used as a part of the power amplifier 310. For example, the structure or the operation of the output end of the power amplifier (for example, the drain of the MOSFET) may have more effect on the nonlinear distortion, rather than the input end of the power amplifier (e.g., the gate of the MOSFET). In this case, occurrence of nonlinear distortion in the power amplifier 310 or the accuracy of the compensating distortion component generated by the distortion generating unit 324 may vary depending on whether the FIR filter is positioned before or after the multiplier. In the example of FIG. 9, by placing the FIR filters at the input end of the multipliers 402 and 412, nonlinearity can be reduced and the accuracy of the compensating distortion component can be improved.

Figure 10:
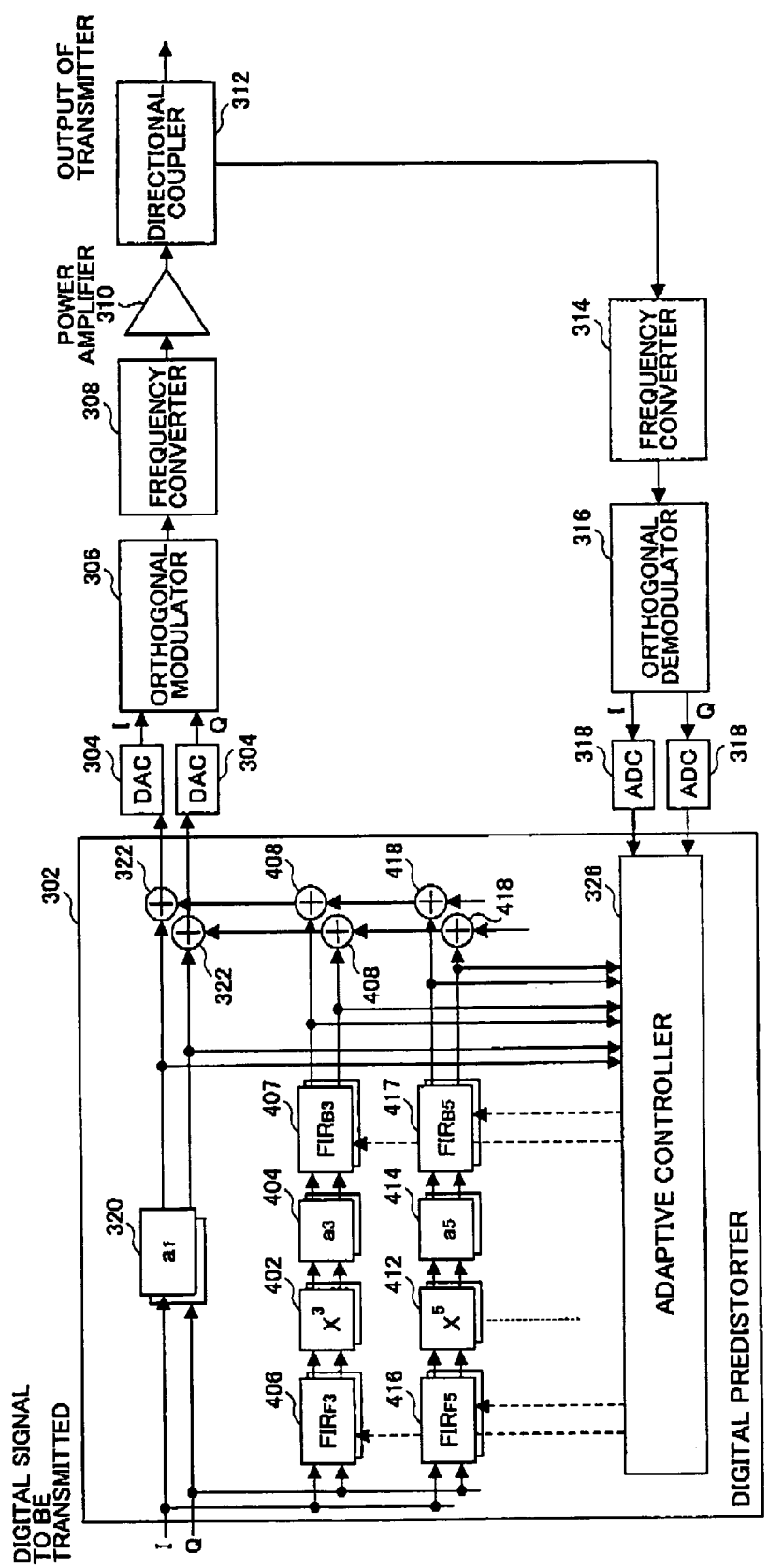
FIG. 10 is a schematic diagram illustrating a part of a transmitter using a digital predistorter according to still another example.

FIG. 10 is a schematic diagram illustrating another modification of the transmitter using the digital predistorter 302. In this example, FIR filters are inserted before and after the multipliers. To be more precise, FIR filters $FIR_{F3}$ 406 and $FIR_{B3}$ 407 are placed respectively before and after the multiplier 402, and FIR filters $FIR_{F5}$ 416 and $FIR_{B5}$ 417 are placed respectively before and after the multiplier 412. This arrangement can further improve the accuracy of the compensating distortion component, while reducing nonlinear component.

Figure 11:
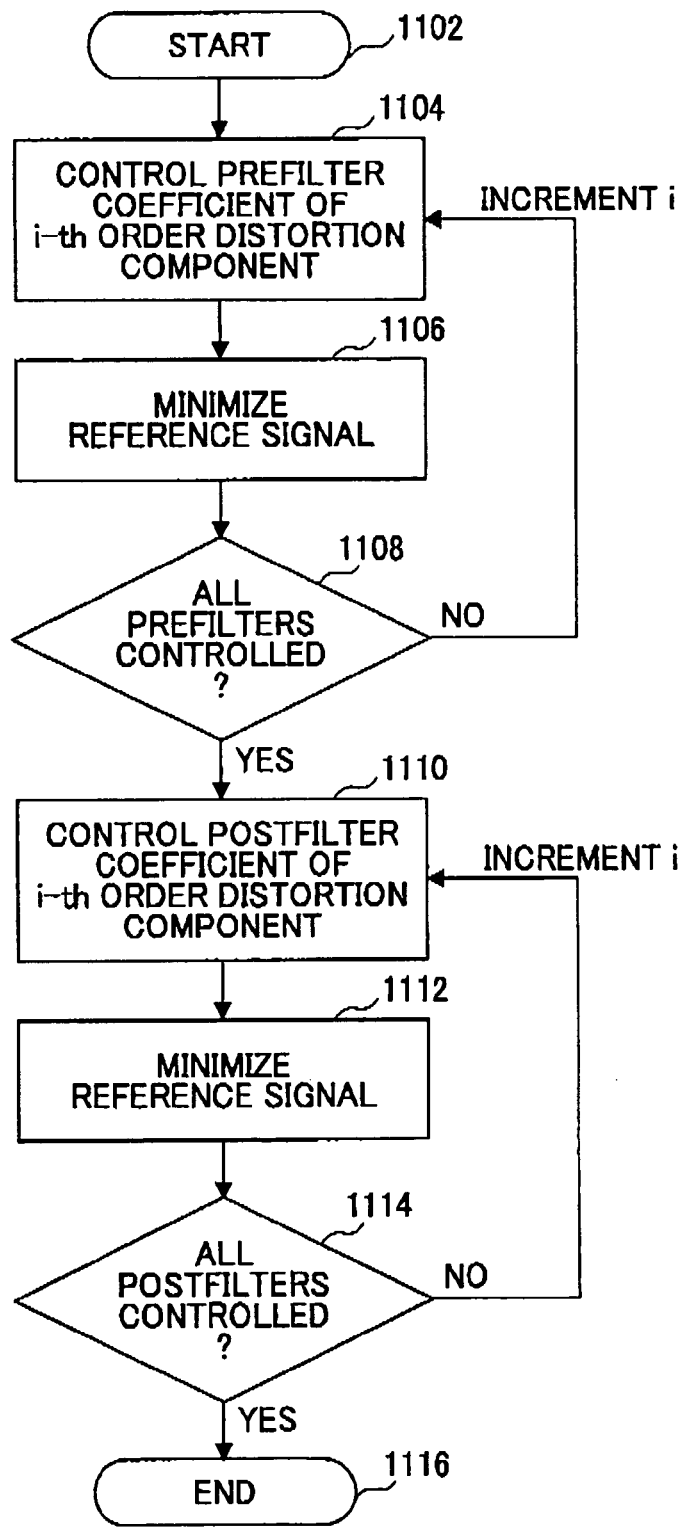
FIG. 11 is a flowchart showing the operation for adjusting the tap coefficients of the finite impulse response (FIR) filters used in the digital predistorter shown in FIG. 10.

FIG. 11 is a flowchart of the operation carried out to control the tap coefficients of the FIR filters shown in FIG. 10. In step 1102, the process starts. In step 1104, a front filter (or a prefilter) $FIR_F$ placed on the input side of the i-th order multiplier (where i is an odd number greater than or equal to 3) is selected as the current filter whose tap coefficient is to be controlled. For example, the front filter $FIR_{F3}$ 406 for the third order distortion is selected for the control. In step 1106, adaptive control is performed to determine the tap coefficient so as to minimize the error signal (or the reference signal) $e_i$. In step 1108, it is determined whether the tap coefficients of all the front filters $FIR_F$ positioned at the input ends of the multipliers have been controlled. If there is an uncontrolled front filter $FIR_F$ still existing (NO in S1108), the degree "i" is incremented, and the process returns to step 1104 to repeat steps 1104, 1106, and 1108. If all the front filters have been controlled in step 1108, then the process proceeds to step 1110.

In step 1110, a back filter (or a postfilter) $FIR_B$ placed on the output side of the i-th order multiplier is selected as the current filter whose tap coefficient is to be controlled. For example, the back filter $FIR_B$ 407 for the third order distortion is selected. In step 1112, adaptive control is performed to determine the tap coefficient so as to minimize the error signal (or the reference signal) $e_i$. In step 1114, it is determined whether the tap coefficients of all the back filters $FIR_B$ positioned at the output ends of the multipliers have been controlled. If there is an uncontrolled back filter FIRB still existing (NO in S1114), the degree "i" is incremented, and the process returns to step 1110 to repeat steps 1110, 1112, and 1114. If all the back filters have been controlled in step 1114, then the process terminates at step 1116.

In this embodiment, the tap coefficient of the front filter placed before the multiplier is adjusted, and then, the tap coefficient of the back filter placed after the multiplier is adjusted. However, the adjusting order may be changed. Simultaneous adjustment at both the input end and the output end is unsuitable because the number of parameters being varied increases, and time and workload required to converge to the appropriate solution may increase.

Figure 12:
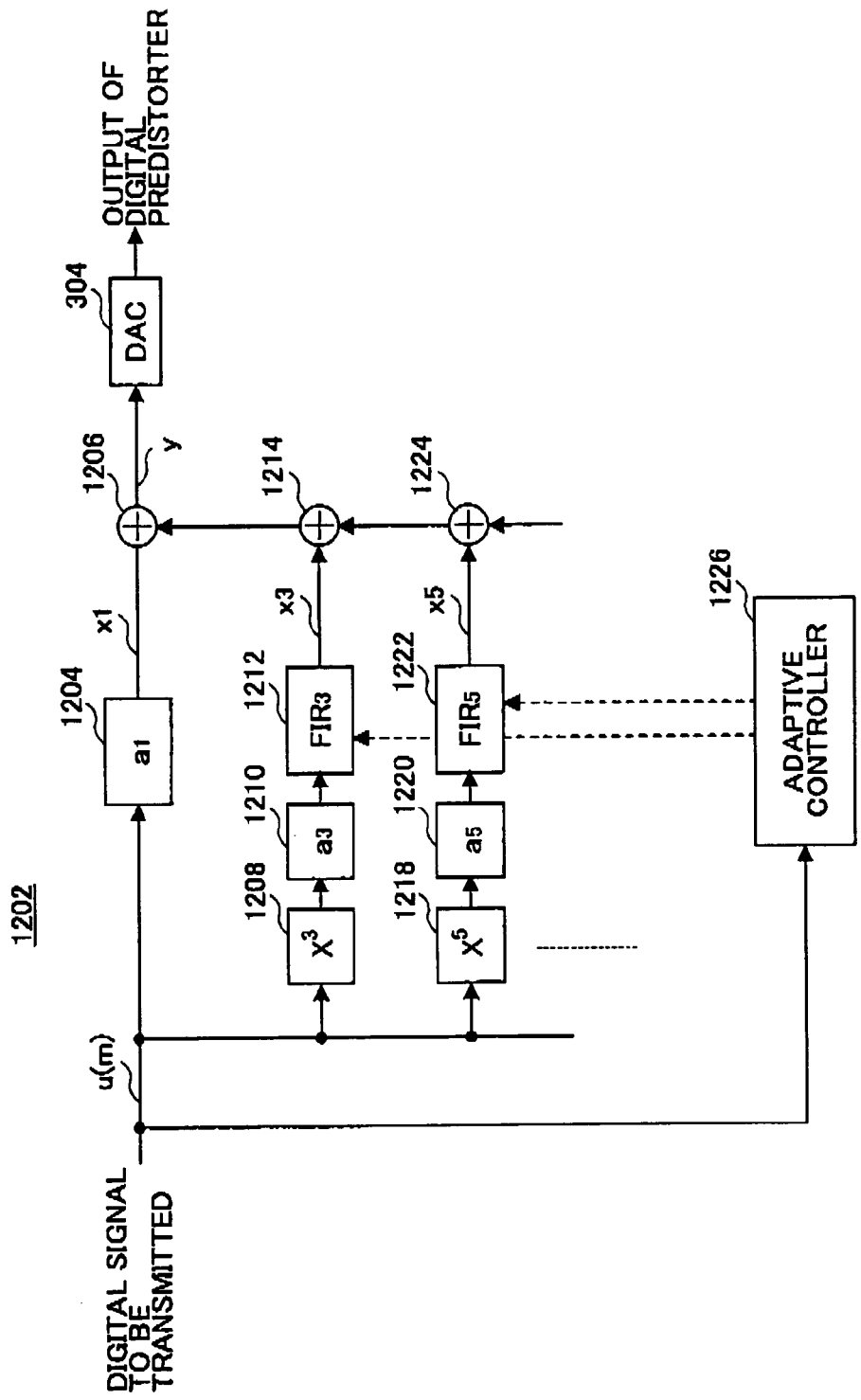
FIG. 12 is a block diagram of a digital predistorter according to the second embodiment of the invention.

FIG. 12 is a block diagram of a digital predistorter 1202 according to the second embodiment of the invention. The digital predistorter 1202 has a coefficient multiplier 1204 and an adder 1206 on the path for the fundamental wave, and has an adaptive controller 1226 on the feed-forward path. The digital predistorter 1202 also has a multiplier 1208, coefficient multiplier 1210, a finite impulse response filter $FIR_3$ 1212, and an adder 1214 on the path for the third order distortion. On the path for the fifth order distortion are provided a multiplier 1218, a coefficient multiplier 1220, a finite impulse response filter $FIR_5$ 1222, and an adder 1224. Although not shown in the figure, similar paths are provided for higher order distortion components.

Each of the coefficient multipliers 1204, 1210, and 1220 multiplies the input signal by a prescribed constant (generally, a complex number) indicated as "a1", "a3", or "a5" in the figure. The third order multiplier 1208 raises the input signal to the third power, and the fifth order multiplier 1218 raises the input signal to the fifth power. Each of $FIR_3$ and $FIR_5$ estimates and outputs a weighted average of the input signal and the past data (previously input signals).

The basic operation of the digital predistorter 1202 of the second embodiment is now explained. A digital transmission signal input to the digital predistorter 1202 is denoted as u(m), where m denotes a parameter designating the number of samplings. If the sampling interval is T, the sampling time t is expressed as $$t=mT. \quad (23)$$

The output $x_1$ of the coefficient multiplier 1204 is expressed as $$x_1 = a_1 * u(m). \tag{24}$$

The output x3 of the third order FIR filter (FIR$_3$) 406 is expressed as $$x_3 = a_3 * (w_{3B}{}^H) * U_3(m), \tag{25}$$

where $w_{3B}$ is the (N+1)-dimensional vector consisting of (N+1) tap coefficients of the third order FIR filter (FIR$_3$), $w^{3BH}$ is the complex conjugate transpose of vector $w_{3B}$, and $U_3(m)$ is the (N+1)-dimensional vector consisting of the current and past signals input to the third order FIR filter (FIR$_3$). The complex conjugate transpose of weighting vector $w_{3B}$ a and the complex conjugate transpose of the input signal vector $U_3(m)$ are expressed as $$w_{3B}{}^H = (w_0(m), w_1(m), \ldots, w_N(m)) \tag{26}$$

$$U_3(m)^H = (u^3(m), u^3(m-1), \ldots, u^3(m-N)). \tag{27}$$

Similarly, the output $x_5$ of the fifth order FIR filter (FIR$_5$) is expressed as $$x_5 = a_5 * (w_{5B}{}^H) * U_5(m)$$

where $w_{5B}$ is the (N+1)-dimensional vector consisting of (N+1) tap coefficients of the fifth order FIR filter (FIR$_5$), and $U_5(m)$ is the (N+1)-dimensional vector consisting of the current and past signals input to the fifth order FIR filter (FIR$_5$). The higher order signal components $X_7, x_9, \ldots$ can be obtained in the same manner.

The adaptive controller 1226 of the second embodiment receives the digital transmission signal u(m) input to the digital predistorter 12012, and creates a new weighting factor based on the received signal u(m) and the past weighting information. For example, the weighting vector $w_{3B}$ for the third order distortion is determined based on a recurrence equation, such as $$w_{3B}(m) = w_{3B}(m-1) + F_{3B}(u(m)), \tag{28}$$

where $F_{3B}$ is the (N+1)-dimensional updating vector that depends on the digital transmission signal u(m). The updating vector is selected depending on the employed adaptive algorithm. For example, a covariance matrix R is determined by estimating the matrix elements from the digital transmission signal u(m) using the Wiener-Hopf method, and the next weighting vector $W_{3B}(m)$ can be obtained by multiplying the present and past transmission signal $U(m)^H = (u(m), u(m-1), \ldots, u(m-N))$ by the determined covariance matrix R. The initial value of the weighting vector may be set in advance in the adaptive algorithm by measuring the frequency-dependency of the distortion component of the power amplifier 310 in advance. Alternatively, the initial value may be set to zero at the beginning, using an algorithm that can learn to find the appropriate initial value through the running of the algorithm.

Since the digital predistorter 1202 of the second embodiment does not require a feedback loop, the tap coefficient can be controlled promptly. The signal processing required for the feedback loop is eliminated, and the adaptive control can be carried out using a simple structure, although, from the viewpoint of improving precision, the feedback control of the first embodiment is preferable.

Figure 13:
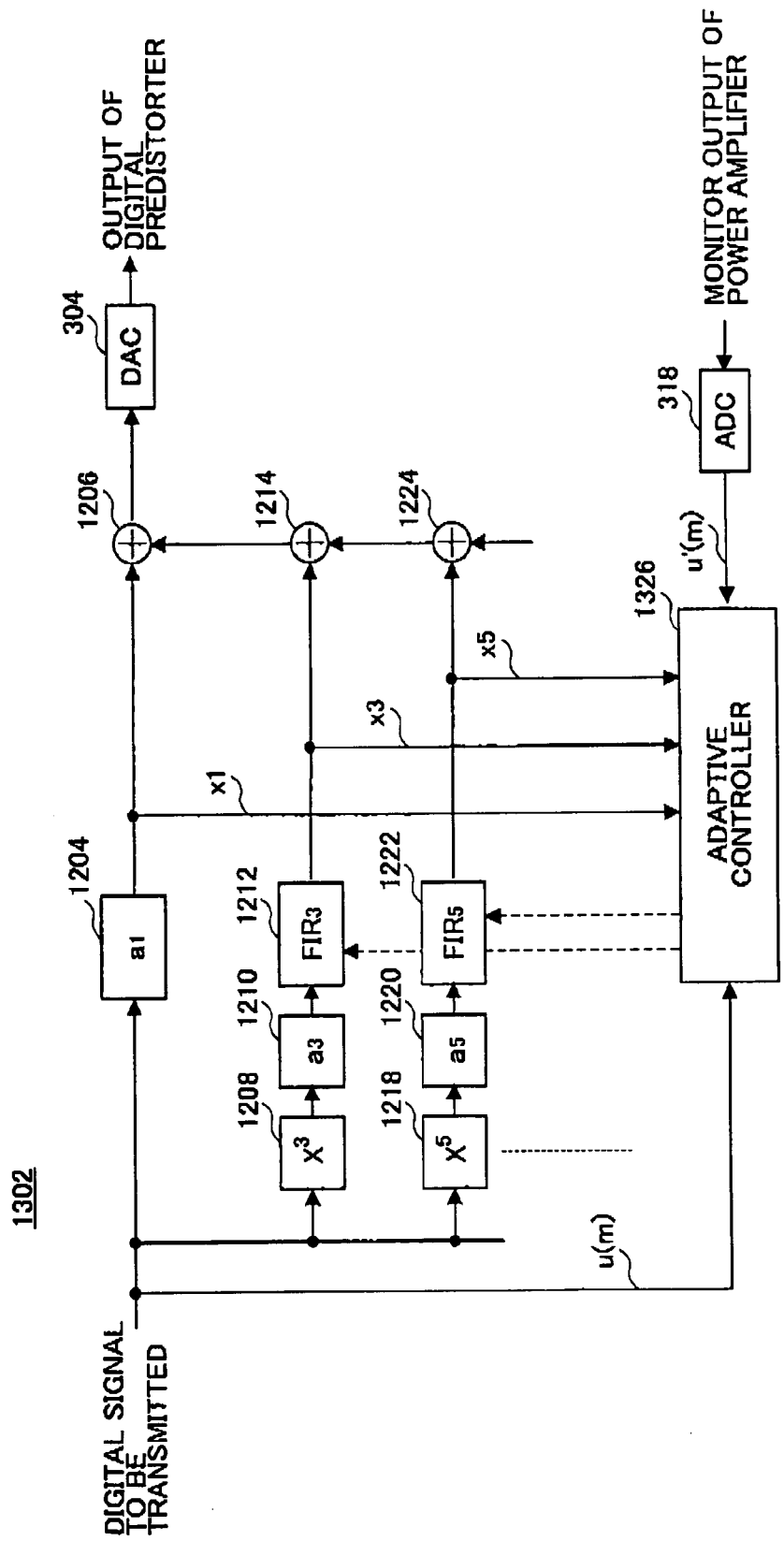
FIG. 13 is a block diagram of a digital predistorter according to the third embodiment of the invention.

FIG. 13 is a block diagram illustrating a digital predistorter 1302 according to the third embodiment of the invention. The digital predistorter 1302 may be used in place of the digital predistorter 302 shown in FIG. 3. The digital predistorter 1302 is configured such that the adaptive controller 1326 receives a feedback signal, in addition to the digital transmission signal u(m). In other words, both a feedback control loop and a feed-forward control loop are provided in the third embodiment.

The adaptive controller 1326 receives a digital transmission signal u(m), which is a feed-forward signal supplied through the feed-forward path, as well as a feedback signal u'(m) through the feedback path, which is generated from the signal having actually passed through the power amplifier 310. The adaptive control is performed to adjust the tap coefficients so as to minimize the difference e(m) between the feed-forward signal u(m) and the feedback signal u'(m).

$$e(m) = u(m) - u'(m) \tag{29}$$

The error signal e(m) does not contain thermal noise or random errors, and therefore, highly precise adaptive control can be performed. The tap coefficient (or the weighing factor) of the third order FIR filter can be determined based on the following recurrence equation $$w_{3B}(m) = w_{3B}(m-1) + F_{3B}(e(m)), \tag{30}$$

where $F_{3B}$ is the (N+1)-dimensional updating vector that depends on the digital error signal e(m), and it differs depending on the employed adaptive algorithm. The weighting factors for the fifth and higher order distortions can be determined in the same manner.

Figure 14:
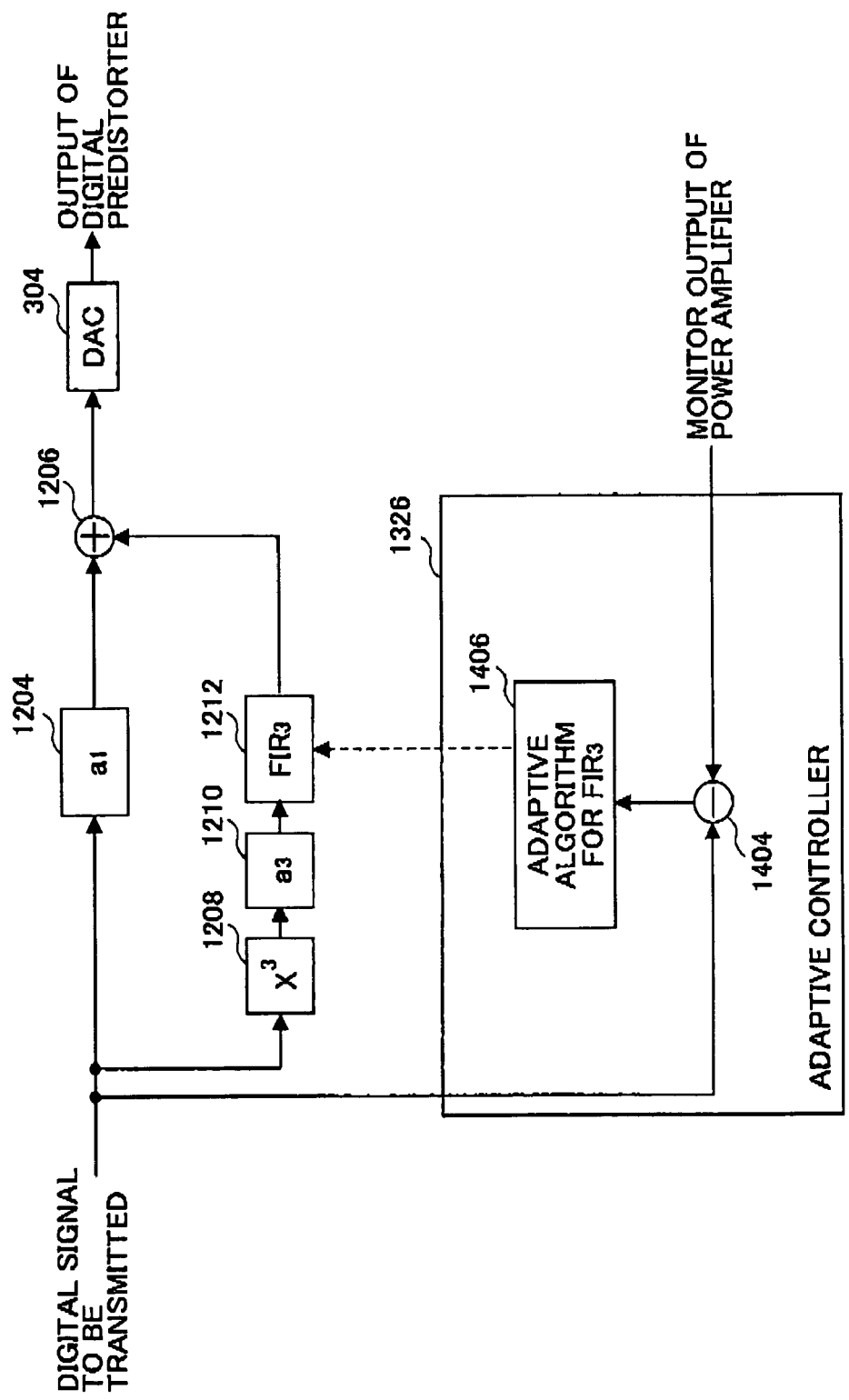
FIG. 14 is a block diagram of an example of the digital predistorter.

FIG. 14 is a block diagram illustrating an example of the digital predistorter 1302 of the third embodiment. In this example, only the third order distortion is considered, and the fifth and higher order distortion components are neglected, as in the example shown in FIG. 5. The adaptive controller 1326 of this example includes a subtractor 1404 and an adaptive algorithm unit 1406. The power level of the feedback signal is regulated to the appropriate level in either the digital or analog domain. The power level may be adjusted in either domain. If the operating range of the analog-to-digital converter (ADC) 318 is not broad enough, then it is desired to adjust the power level of the signal in the digital domain. If the power level of the signal input to the ADC is adjusted to the lower level at the ADC with an insufficient operating range, the precision of the output signal from the ADC may be degraded. Since the gain of the power amplifier 310 is known, to what power level the feedback signal is adjusted can be determined precisely.

The subtractor 1404 outputs an error signal e(m), which represents the difference between the feed-forward signal u(m) and the appropriately level-adjusted feedback signal u'(m), to the adaptive algorithm unit 1406. The adaptive algorithm unit 1406 controls the tap coefficient of the filter FIR$_3$ 1212 so as to minimize the error signal e(m), using a known adaptive algorithm, such as one described above.

Figure 15:
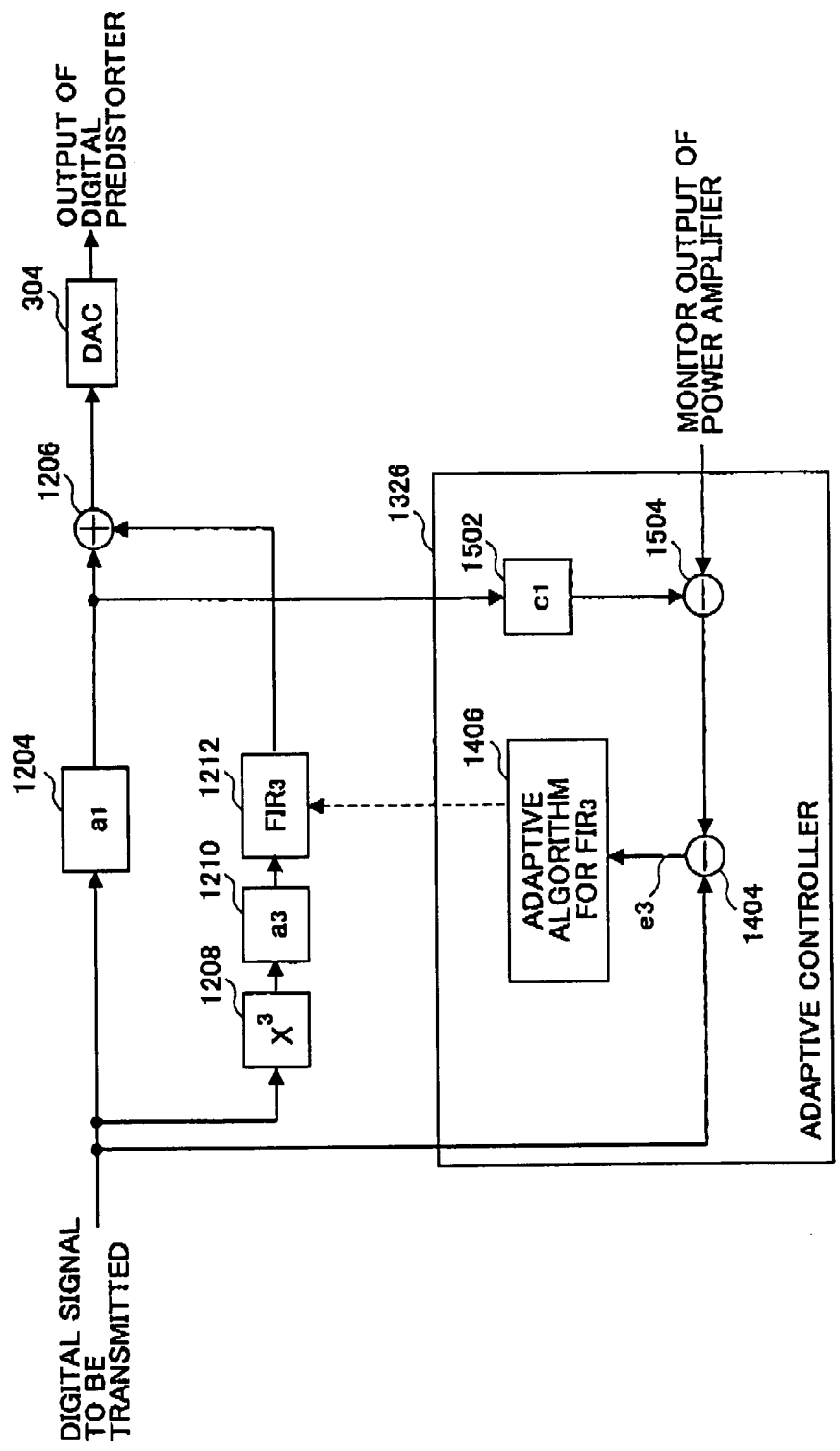
FIG. 15 is a block diagram of another example of the digital predistorter.

FIG. 15 is a block diagram illustrating another example of the digital predistorter 1302 of the third embodiment. In this example, only the third order distortion is considered, and the fifth and higher order distortion components are neglected, as in the example shown in FIG. 5. The adaptive controller 1326 of this example includes a coefficient multiplier 1502 and a subtractor 1504, in addition to the adaptive algorithm unit 1406 and the subtractor 1404. The subtractor 1404 generates and outputs an error signal e(m), which represents $(b_1 - c_1 - 1/a_1)x_1 + b_1 x_3 = b_1 x_3$, to the adaptive algorithm unit 1406. The adaptive algorithm unit 1406 controls the tap coefficient of filter FIR$_3$ 1212 so as to minimize the error signal e(m), using Equation (30).

Figure 16:
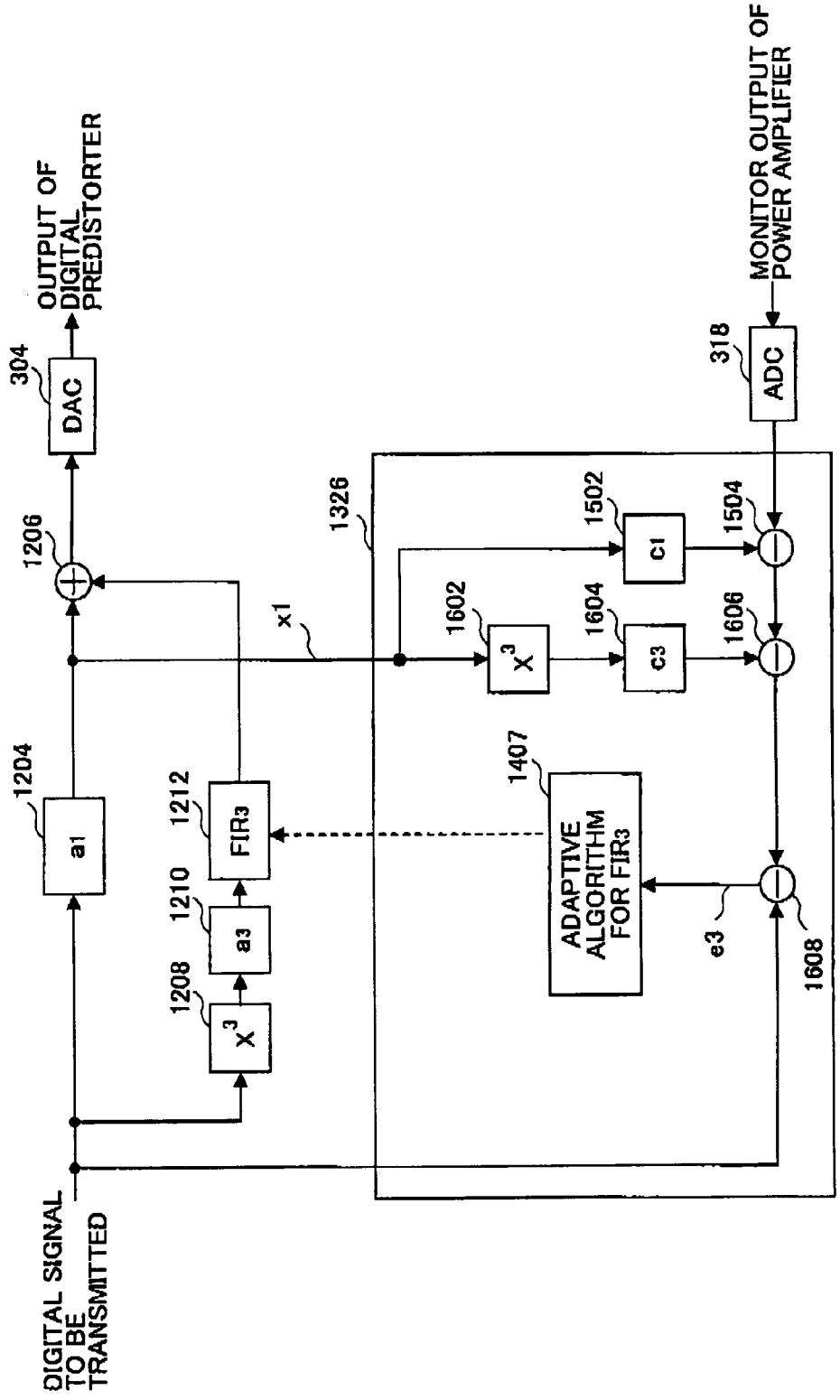
FIG. 16 is a block diagram of still another example of the digital predistorter.

FIG. 16 is a block diagram illustrating still another example of the digital predistorter 1302 of the third embodiment. In this example, only the third order distortion is considered, and the fifth and higher order distortion components are neglected, as in the example shown in FIG. 6. The adaptive controller 1326 of this example includes a third-order multiplier 1602, a coefficient multiplier 1604, and subtractors 1606 and 1608, in addition to the coefficient multiplier 1502, the subtractor 1504, and the adaptive algorithm unit 1407. The subtractor 1608 generates and outputs an error signal e(m), which represents $(b_1-c_1-1/a_1)x_1+(b_3-c_3)x_1^3+b_1x_3=b_1x_3$, to the adaptive algorithm unit 1407. The adaptive algorithm unit 1407 controls the tap coefficient of filter $FIR_3$ 1212 so as to minimize the error signal e(m), using Equation (30).

Figure 17:
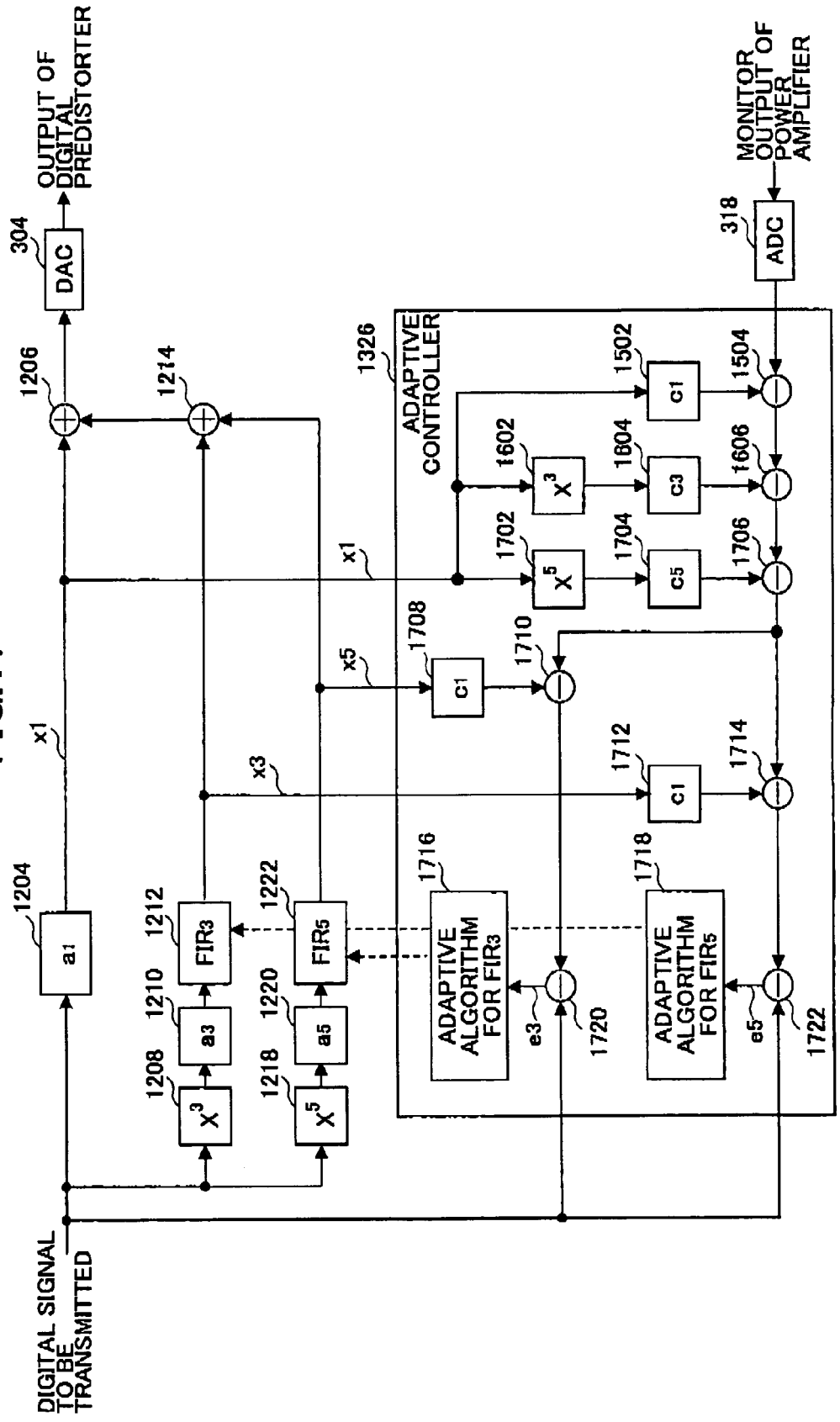
FIG. 17 is a block diagram of yet another example of the digital predidstorter.

FIG. 17 is a block diagram illustrating yet another example of the digital predistorter 1302 of the third embodiment. In this example, both the third order distortion and the fifth order distortion are considered, as in the example shown in FIG. 7. The adaptive controller 1326 includes a coefficient multiplier 1502, a subtractor 1504, a third-order multiplier, a coefficient multiplier 1604, a subtractor 1606, and an adaptive algorithm unit 1716 for controlling the $FIR_3$ for the third order distortion. In addition, the adaptive controller 1326 includes a fifth-order multiplier 1702, a coefficient multiplier 1704, a subtractor 1706, a coefficient multiplier 1708, a subtractor 1710, a coefficient multiplier 1712, a subtractor 1714, an adaptive algorithm unit 1718 for controlling $FIR_5$, and subtractors 1720 and 1722.

Figure 18:
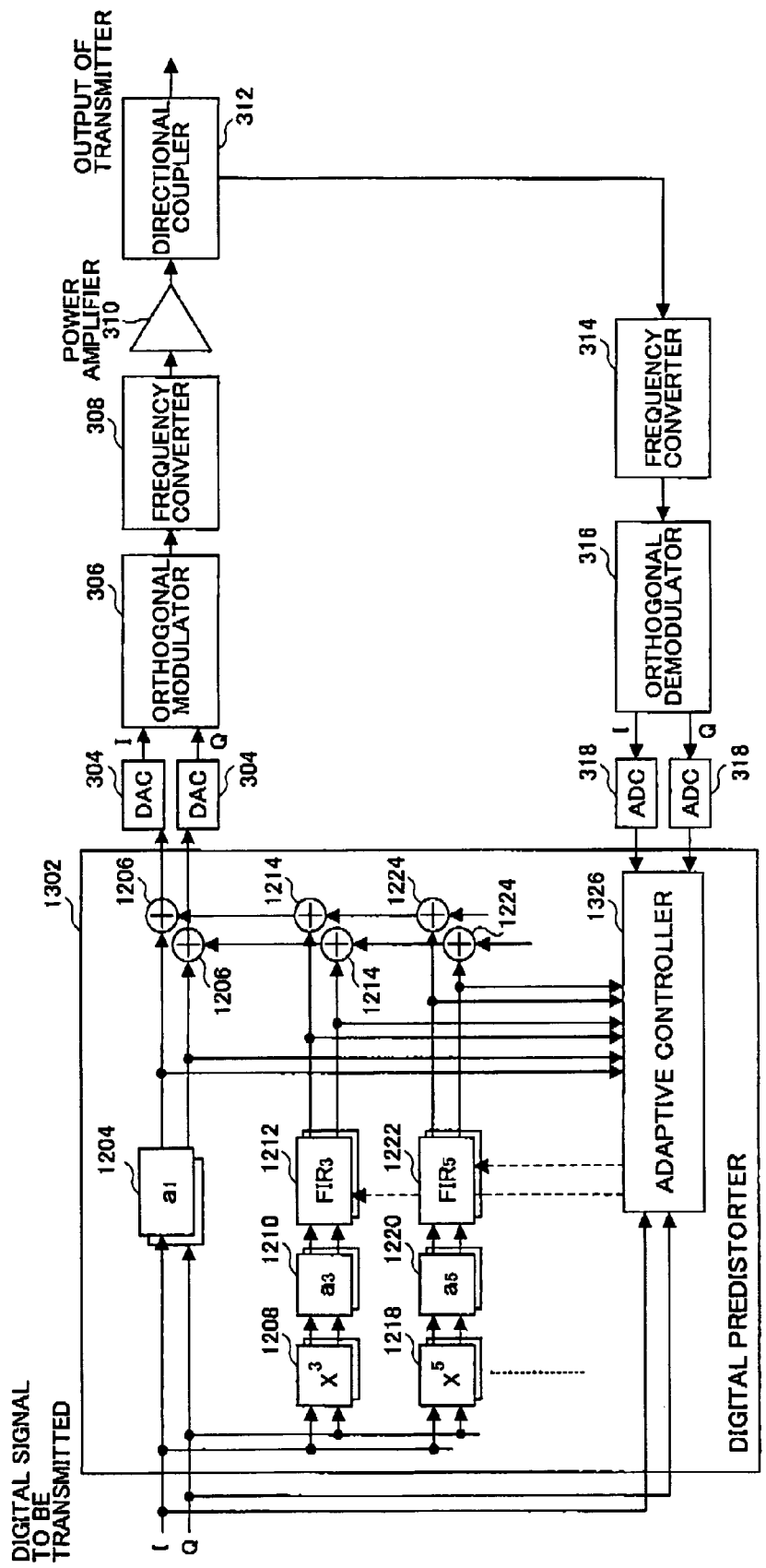
FIG. 18 is a schematic diagram illustrating a part of a transmitter using a digital predistorter according to the third embodiment of the invention.

The subtractor 1720 generates and outputs an error signal $e_3(m)$ with respect to the third order distortion, to the adaptive algorithm unit 1716. The adaptive algorithm unit 1716 controls the tap coefficient of the filter $FIR_3$ 1212 so as to minimize the error signal $e_3(m)$ The subtractor 1722 generates and outputs an error signal $e_5(m)$ with respect to the fifth order distortion, to the adaptive algorithm unit 1718. The adaptive algorithm unit 1718 controls the tap coefficient of the filter $FIR_5$ 1222 so as to minimize the error signal $e_5(m)$ FIG. 18 is schematic diagram illustrating a part of a transmitter employing a digital predistorter 1302 shown in FIG. 13, in which the finite impulse response filters $FIR_3$ and $FIR_5$ are placed after the coefficient multipliers 1210 and 1220, respectively. In FIG. 18, distortion compensation is performed for each of the inphase component (I) and the quadrature component (Q).

Figure 19:
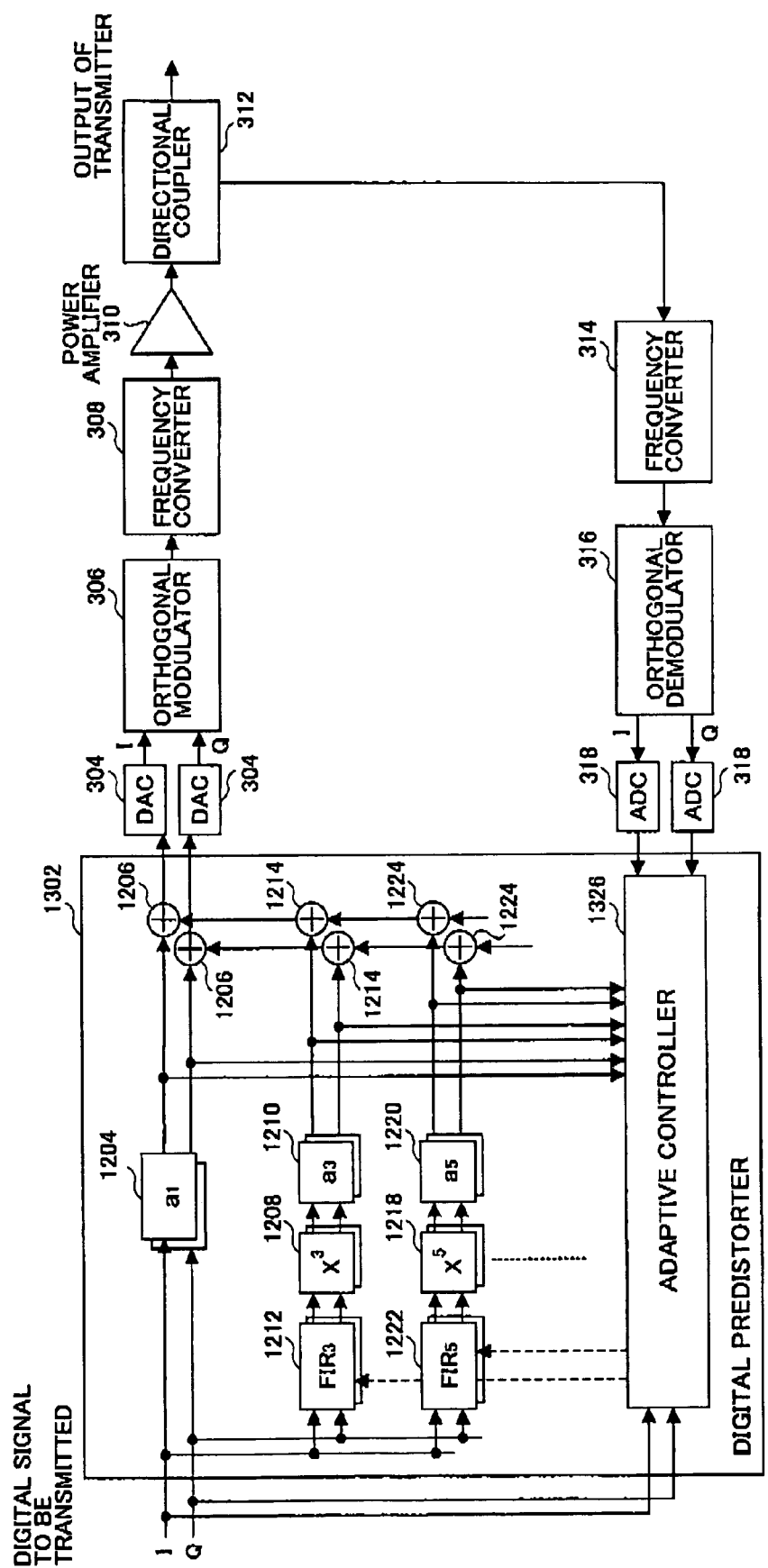
FIG. 19 is a schematic diagram illustrating a part of a transmitter using an example of the digital predistorter.

FIG. 19 is a schematic diagram illustrating a part of a transmitter using a digital predistorter 1302 whose structure is similar to that shown in FIG. 13. In this example, the outputs of the finite impulse response filters $FIR_3$ and $FIR_5$ are connected to the inputs of the multipliers 1208 and 1218, respectively. By placing the FIR filters before the coefficient multipliers 1210 and 1220, compensating distortion components can be generated more precisely, while nonlinear distortion can be reduced.

Figure 20:
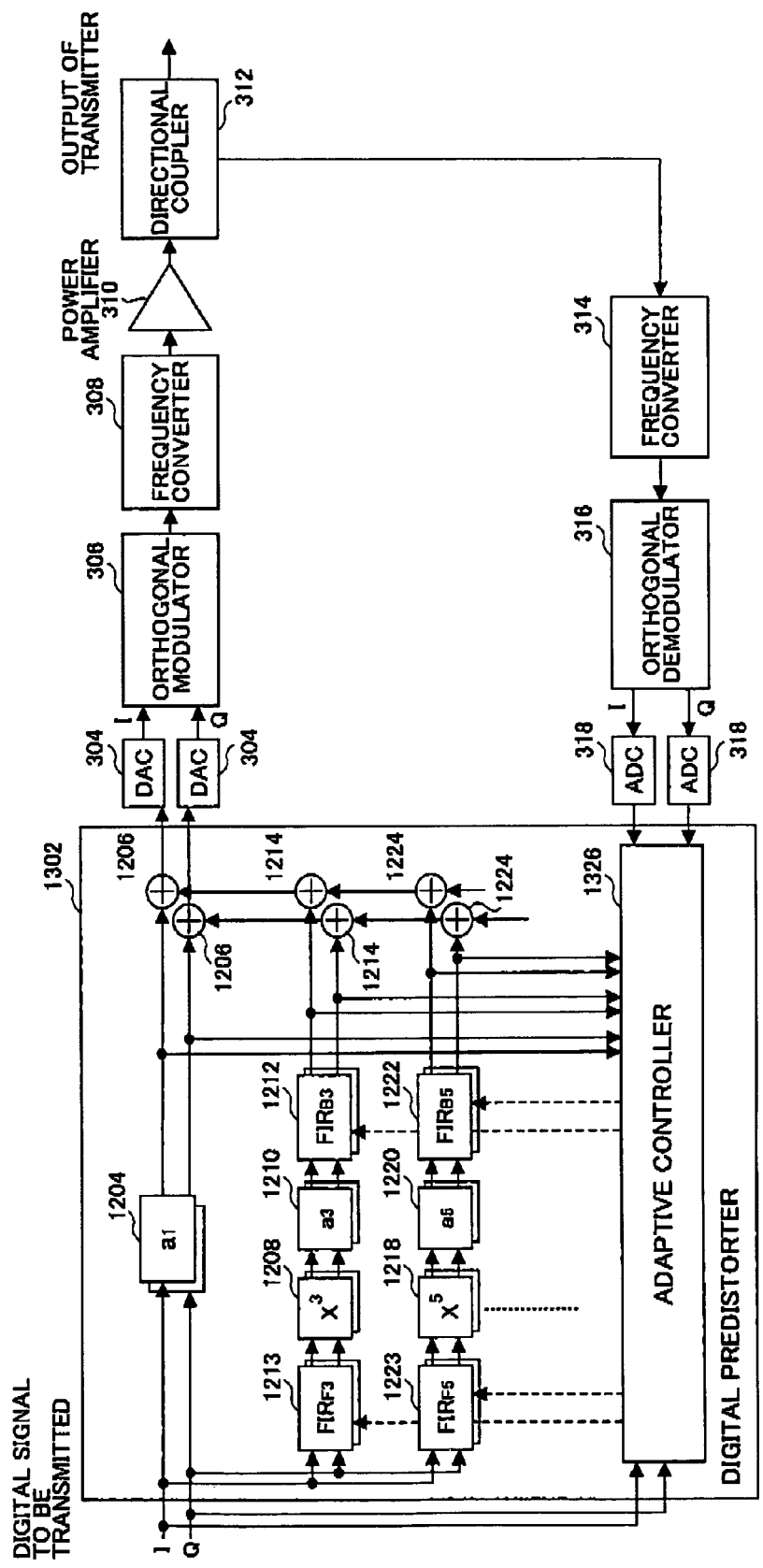
FIG. 20 is a schematic diagram illustrating a part of a transmitter using another example of the digital predistorter.

In the examples shown in FIG. 20, FIR filters are placed on both sides of the associated multiplier in each path. To be more precise, a front filter $FIR_{F3}$ 1213 and a back filter $FIR_{B3}$ 1212 are placed respectively before and after the coefficient multiplier 1210 in the path for the third order distortion, and a front filter $FIR_{F5}$ 1223 and a back filter $FIR_{B5}$ 1222 are placed respectively before and after the coefficient multiplier 1220 in the path for the fifth order distortion. This arrangement can further improve the precision in generating compensating distortion, while reducing nonlinearity.

This patent application is based on and claims the benefit of the earlier filing dates of Japanese Patent Application No. 2004-021031 filed Jan. 29, 2004, the entire contents of which are hereby incorporated by reference.

What is claimed is:

1. A digital predistorter using a power series model to compensate for nonlinear distortion of a power amplifier, comprising:
   a distortion generating unit configured to introduce a nonlinear distortion component of a prescribed order into a digital input signal supplied to the digital predistorter, the distortion generating unit having a multiplier configured to raise a signal based on the digital input signal to a power consistent with prescribed order of the nonlinear distortion component, and a finite impulse response filter connected in series with the multiplier, and an output of the finite impulse response filter is connected to an input of the multiplier; and
   an adaptive controller configured to receive a reference signal and adaptively adjust a tap coefficient of the finite impulse response filter so as to bring the reference signal to a desired level.

2. The digital predistorter of claim 1, wherein the adaptive controller determines the tap coefficient based on present and past digital signals input to the digital predistorter.

3. The digital predistorter of claim 1, wherein the reference signal is a feedback signal obtained by subtracting a first signal in proportion to the digital input signal or to a power of the digital input signal from a second signal derived from an output of the power amplifier.

4. The digital predistorter of claim 1, wherein the reference signal is at least one of a feed-forward signal derived from the digital input signal and a feedback signal derived from an output of the power amplifier.

5. The digital predistorter of claim 4, wherein the adaptive controller receives the feed-forward signal and the feedback signal as the reference signals, and adjust the tap coefficient of the finite impulse filter so as to reduce a difference between the feed-forward signal and the feedback signal.

6. The digital predistorter of claim 1, wherein the distortion generating unit is configured to introduce a plurality of different orders of nonlinear distortion components into the digital input signal.

7. The digital predistorter of claim 6, wherein the distortion generating unit has a plurality of sets of the multiplier and the finite impulse filter connected in series, each set being provided to one of paths corresponding to the different orders of nonlinear distortion components.

8. The digital predistorter of claim 1, wherein an output of the multiplier is connected to an input of a second finite impulse response filter.

9. A digital predistorter using a power series model to compensate for nonlinear distortion of a power amplifier, comprising:
   a distortion generating unit configured to introduce a nonlinear distortion component of a prescribed order into a digital input signal supplied to the digital predistorter, the distortion generating unit having a multiplier configured to raise a signal based on the digital input signal to a power consistent with the prescribed order of the nonlinear distortion component, a first finite impulse response filter connected in series with the multiplier, a second finite impulse response filter connected in series with the multiplier, and one of the finite impulse response filters is positioned before the multiplier and the other is positioned after the multiplier; and
   an adaptive controller configured to receive a reference signal and adaptively adjust a tap coefficient of the first finite impulse response filter so as to bring the reference signal to a desired level.

10. The digital predistorter of claim 9, wherein the adaptive controller determines the tap coefficient based on present and past digital signals input to the digital predistorter.

11. The digital predistorter of claim 9, wherein the reference signal is a feedback signal obtained by subtracting a first signal in proportion to the digital input signal or to a power of the digital input signal from a second signal derived from an output of the power amplifier.

12. The digital predistorter of claim 9, wherein the reference signal is at least one of a feed-forward signal derived from the digital input signal and a feedback signal derived from an output of the power amplifier.

13. The digital predistorter of claim 11, wherein the adaptive controller receives the feed-forward signal and the feedback signal as the reference signals, and adjust the tap coefficient of the first finite impulse filter so as to reduce a difference between the feed-forward signal and the feedback signal.

14. The digital predistorter of claim 9, wherein the distortion generating unit is configured to introduce a plurality of different orders of nonlinear distortion components into the digital input signal.

15. The digital predistorter of claim 14, wherein the distortion generating unit has a plurality of sets of the multiplier and the first finite impulse filter connected in series, each set being provided to one of paths corresponding to the different orders of nonlinear distortion components.

16. The digital predistorter of claim 9, wherein an output of the multiplier is connected to an input of the first finite impulse response filter.

17. A transmitter comprising:
a power amplifier configured to amplify a digital transmission signal; and
a digital predistorter connected to the power amplifier and configured to compensate for nonlinear distortion of the power amplifier using a power series model, the digital predistorter including:
a distortion generating unit configured to introduce a nonlinear distortion component of a prescribed order into the digital transmission signal supplied to the digital predistorter prior to being input to the power amplifier, the distortion generating unit having a multiplier configured to raise a signal based on the digital transmission signal to a power consistent with the prescribed order of the nonlinear distortion component, and a finite impulse response filter connected in series with the multiplier and an output of the finite impulse response filter is connected to an input of the multiplier; and
an adaptive controller configured to receive a reference signal and adaptively adjust a tap coefficient of the finite impulse response filter so as to bring the reference signal to a desired level.

18. A transmitter comprising:
a power amplifier configured to amplify a digital transmission signal; and
a digital predistorter connected to the power amplifier and configured to compensate for nonlinear distortion of the power amplifier using a power series model, the digital predistorter including:
a distortion generating unit configured to introduce a nonlinear distortion component of a prescribed order into the digital transmission signal supplied to the digital predistorter prior to being input to the power amplifier, the distortion generating unit having a multiplier configured to raise a signal based on the digital transmission signal to a power consistent with the prescribed order of the nonlinear distortion component, and a first finite impulse response filter connected in series with the multiplier, a second finite impulse response filter connected in series with the multiplier, and one of the finite impulse response filters is positioned before the multiplier and the other is positioned after the multiplier; and
an adaptive controller configured to receive a reference signal and adaptively adjust a tap coefficient of the first finite impulse response filter so as to bring the reference signal to a desired level.

* * * * *